US012641350B2

(12) United States Patent
Saito et al.

(10) Patent No.: US 12,641,350 B2
(45) Date of Patent: May 26, 2026

(54) DETECTION DEVICE

(71) Applicant: Magnolia White Corporation, Tokyo (JP)

(72) Inventors: Keiichi Saito, Tokyo (JP); Takashi Nakamura, Tokyo (JP); Atsunori Oyama, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 497 days.

(21) Appl. No.: 18/230,508

(22) Filed: Aug. 4, 2023

(65) Prior Publication Data

US 2023/0379599 A1 Nov. 23, 2023

Related U.S. Application Data

(63) Continuation of application No. PCT/JP2022/003810, filed on Feb. 1, 2022.

(30) Foreign Application Priority Data

Feb. 8, 2021 (JP) ................................. 2021-018570

(51) Int. Cl.
| | |
|---|---|
| *H04N 25/709* | (2023.01) |
| *H04N 25/76* | (2023.01) |
| *H10F 39/18* | (2025.01) |

(52) U.S. Cl.
CPC ........... *H04N 25/709* (2023.01); *H04N 25/76* (2023.01); *H10F 39/18* (2025.01)

(58) Field of Classification Search
CPC ...... H04N 25/709; H04N 25/76; H04N 25/30; H04N 25/443; H04N 25/78; H10F 39/18; H10F 30/20; H10F 39/12
See application file for complete search history.

(56) References Cited

U.S. PATENT DOCUMENTS

| | | | |
|---|---|---|---|
| 2005/0117041 A1 | 6/2005 | Tsukamoto | |
| 2017/0229599 A1 | 8/2017 | Sakata et al. | |

(Continued)

FOREIGN PATENT DOCUMENTS

| | | |
|---|---|---|
| JP | 2005167598 A | 6/2005 |
| JP | 2020178249 A | 10/2020 |

(Continued)

OTHER PUBLICATIONS

International Search Report of corresponding PCT application PCT/JP2021/044940, dated Mar. 29, 2022.

*Primary Examiner* — Sinh Tran
*Assistant Examiner* — Zhenzhen Wu
(74) *Attorney, Agent, or Firm* — K&L Gates LLP

(57) ABSTRACT

According to an aspect, a detection device includes: photodiodes configured to perform detection in a detection period, a power supply control circuit, and power supply circuits configured to supply, to each photodiode, a first potential or a second potential based on a control signal from the power supply control circuit. The photodiodes are respectively provided for partial detection areas of a detection area. The power supply control circuit is configured to detect an output level of a signal output from each of the partial detection areas when the first potential is supplied to the photodiodes during a setting period different from the detection period, and control the power supply circuits so as to supply the second potential to the photodiode of the partial detection area in which the output level of the signal is equal to or higher than a predetermined threshold during the detection period.

5 Claims, 21 Drawing Sheets

(56) References Cited

U.S. PATENT DOCUMENTS

| | | |
|---|---|---|
| 2018/0012069 A1 | 1/2018 | Chung et al. |
| 2020/0335545 A1 | 10/2020 | Ohshitanai |
| 2022/0036036 A1 | 2/2022 | Kato et al. |
| 2022/0397650 A1* | 12/2022 | Kubota ................. G01S 17/894 |
| 2024/0276120 A1* | 8/2024 | Sato ........................ H10F 39/12 |
| 2025/0124886 A1* | 4/2025 | Chen .................... G09G 3/3655 |

FOREIGN PATENT DOCUMENTS

| | | | |
|---|---|---|---|
| WO | 2016013170 A1 | 1/2016 |
| WO | 2020213619 A1 | 10/2020 |

* cited by examiner

| | 1 | 2 | 3 | ... | N-1 | N |
|---|---|---|---|---|---|---|
| 1 | AFESIG (1, 1) | AFESIG (2, 1) | AFESIG (3, 1) | | AFESIG (N-1, 1) | AFESIG (N, 1) |
| 2 | AFESIG (1, 2) | AFESIG (2, 2) | AFESIG (3, 2) | | AFESIG (N-1, 2) | AFESIG (N, 2) |
| 3 | AFESIG (1, 3) | AFESIG (2, 3) | AFESIG (3, 3) | | AFESIG (N-1, 3) | AFESIG (N, 3) |
| ... | | | | | | |
| M-1 | AFESIG (1, M-1) | AFESIG (2, M-1) | AFESIG (3, M-1) | | AFESIG (N-1, M-1) | AFESIG (N, M-1) |
| M | AFESIG (1, M) | AFESIG (2, M) | AFESIG (3, M) | | AFESIG (N-1, M) | AFESIG (N, M) |

FIG.22

|     | 1 | 2 | 3 | ⋯ | N-1 | N |
|-----|---|---|---|---|-----|---|
| 1   | H | H | H |   | H   | H |
| 2   | H | L | L |   | H   | H |
| 3   | H | H | H |   | L   | H |
| ⋮   |   |   |   |   |     |   |
| M-1 | L | L | H |   | L   | H |
| M   | H | H | H |   | H   | H |

DETECTION DEVICE

CROSS-REFERENCE TO RELATED APPLICATION

This application claims the benefit of priority from Japanese Patent Application No. 2021-018570 filed on Feb. 8, 2021 and International Patent Application No. PCT/JP2022/003810 filed on Feb. 1, 2022, the entire contents of which are incorporated herein by reference.

BACKGROUND

1. Technical Field

What is disclosed herein relates to a detection device.

2. Description of the Related Art

In these years, optical biometric sensors are known as biometric sensors used for personal authentication, for example. Fingerprint sensors (refer to United States Patent Application Publication No. 2018/0012069 (US-A-2018/0012069), for example) and vein sensors are known as such biometric sensors. In a fingerprint sensor described in US-A-2018/0012069, a plurality of photoelectric conversion elements such as photodiodes are arranged on a semiconductor substrate. Each of the photoelectric conversion elements outputs a signal that changes depending on the amount of light emitted thereto.

Organic photo detectors, such as organic photodiodes (OPDs), are known as the photoelectric conversion elements for detection. In detection devices using the OPDs, when variations are generated in an organic semiconductor layer, the characteristics of the OPDs may vary, whereby degradation in detection accuracy and imaging characteristics is likely to be caused.

For the foregoing reasons, there is a need for a detection device capable of improving the detection accuracy and the imaging characteristics.

SUMMARY

According to an aspect, a detection device includes: a plurality of photodiodes configured to detect information on an object to be detected in a detection area during a predetermined detection period; a power supply control circuit configured to individually control a reverse bias voltage applied to each of the photodiodes; and a plurality of power supply circuits configured to supply, to each of the photodiodes, a first potential at which the reverse bias voltage is set to a first voltage or a second potential at which the reverse bias voltage is set to a second voltage lower than the first voltage, based on a control signal from the power supply control circuit. The photodiodes are respectively provided for a plurality of partial detection areas of the detection area. The power supply control circuit is configured to detect an output level of a signal output from each of the partial detection areas when the first potential is supplied to the photodiodes during a setting period different from the detection period, and control the power supply circuits so as to supply the second potential to the photodiode of the partial detection area in which the output level of the signal is equal to or higher than a predetermined threshold during the detection period.

BRIEF DESCRIPTION OF THE DRAWINGS

FIG. 7 is a waveform timing chart illustrating an operation example during a reset period in FIG. 6;

FIG. 8 is a waveform timing chart illustrating an operation example during a read period in FIG. 6;

FIG. 20 illustrates an example of AFE output signal level information;

FIG. 22 illustrates an example of sensor power supply potential setting information.

DETAILED DESCRIPTION

The following describes a mode (embodiment) for carrying out the present disclosure in detail with reference to the drawings. The present disclosure is not limited to the description of the embodiment given below. Components described below include those easily conceivable by those skilled in the art or those substantially identical thereto. In addition, the components described below can be combined as appropriate. What is disclosed herein is merely an example, and the present disclosure naturally encompasses appropriate modifications easily conceivable by those skilled in the art while maintaining the gist of the disclosure. To further clarify the description, the drawings may schematically illustrate, for example, widths, thicknesses, and shapes of various parts as compared with actual aspects thereof. However, they are merely examples, and interpretation of the present disclosure is not limited thereto. The same component as that described with reference to an already mentioned drawing is denoted by the same reference sign through the description and the drawings, and detailed description thereof may not be repeated where appropriate.

In this disclosure, when an element is described as being "on" another element, the element can be directly on the other element, or there can be one or more elements between the element and the other element.

Embodiment

Figure 1:
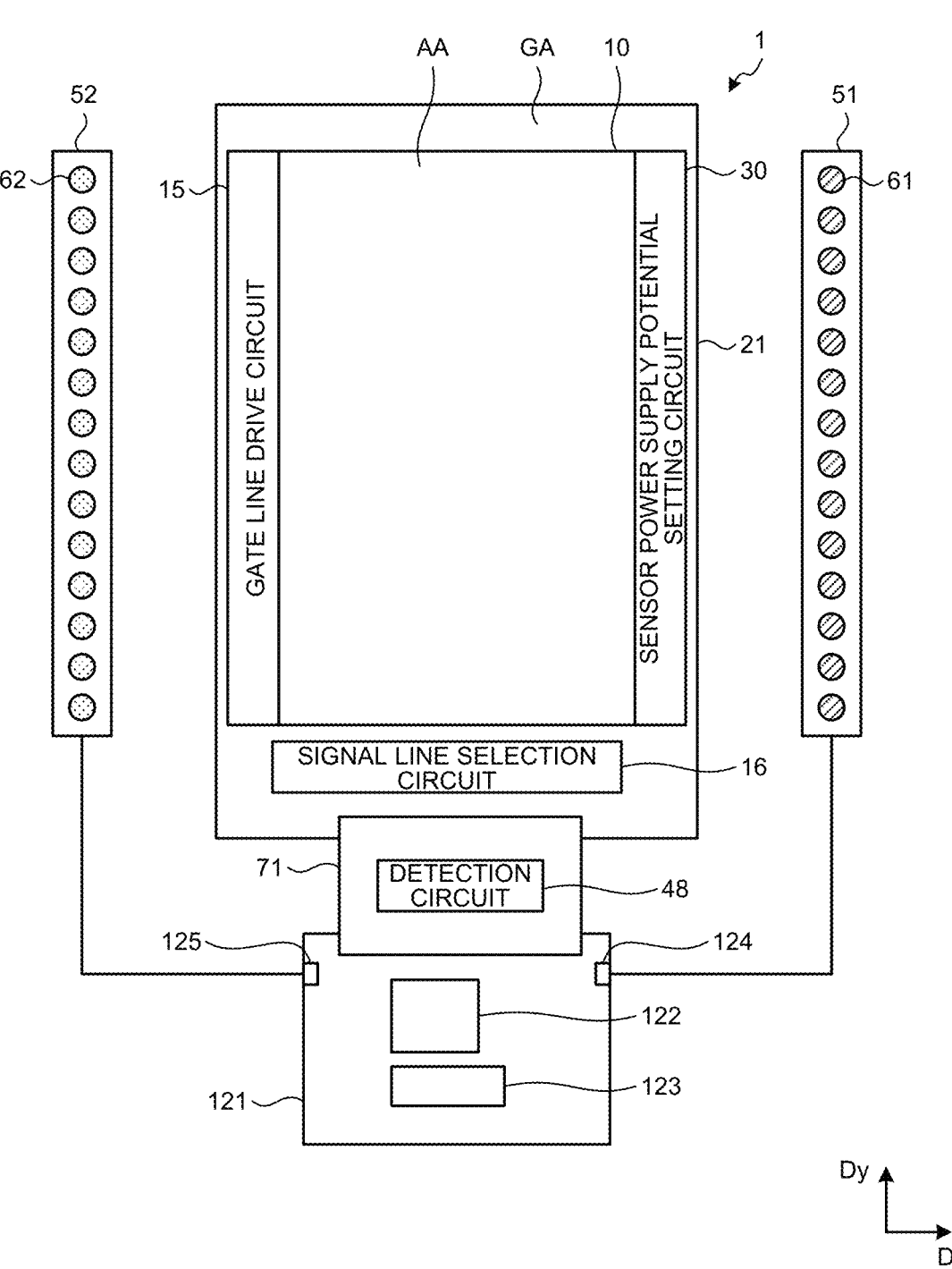
FIG. 1 is a plan view illustrating a detection device according to an embodiment.

FIG. 1 is a plan view illustrating a detection device according to an embodiment. As illustrated in FIG. 1, a detection device 1 includes a sensor base member 21, a sensor 10, a gate line drive circuit 15, a signal line selection circuit 16, a sensor power supply potential setting circuit 30, a detection circuit 48, a control circuit 122, a power supply circuit 123, a first light source base member 51, a second light source base member 52, a first light source 61, and a second light source 62. The first light source base member 51 is provided with a plurality of the first light sources 61. The second light source base member 52 is provided with a plurality of the second light sources 62.

The sensor base member 21 is electrically coupled to a control substrate 121 through a flexible printed circuit board 71. The flexible printed circuit board 71 is provided with the detection circuit 48. The control substrate 121 is provided with the control circuit 122 and the power supply circuit 123. In the present disclosure, the sensor base member 21 is provided with an organic semiconductor layer in which a plurality of optical sensors (photodiodes) PD to be described later are formed.

The control circuit 122 is, for example, a field-programmable gate array (FPGA). The control circuit 122 supplies control signals to the sensor 10, the gate line drive circuit 15, the signal line selection circuit 16, and the sensor power supply potential setting circuit 30 to control a detection operation of the sensor 10. The control circuit 122 also supplies control signals to the first and the second light sources 61 and 62 to control lighting and non-lighting of the first and the second light sources 61 and 62.

The power supply circuit 123 supplies voltage signals including, for example, a sensor power supply potential VDDSNS (refer to FIG. 4) to the sensor 10, the gate line drive circuit 15, the signal line selection circuit 16, and the sensor power supply potential setting circuit 30. The power supply circuit 123 also supplies a power supply voltage to the first and the second light sources 61 and 62.

The sensor base member 21 has a detection area AA and a peripheral area GA. The detection area AA is an area provided with the optical sensors PD (refer to FIG. 4) included in the sensor 10. The peripheral area GA is an area between the outer perimeter of the detection area AA and the ends of the sensor base member 21 and is an area not provided with the optical sensors PD.

The gate line drive circuit 15, the signal line selection circuit 16, and the sensor power supply potential setting circuit 30 are provided in the peripheral area GA. Specifically, the gate line drive circuit 15 is provided in an area extending along a second direction Dy in the peripheral area GA. The signal line selection circuit 16 is provided in an area extending along a first direction Dx in the peripheral area GA, and is provided between the sensor 10 and the detection circuit 48. The sensor power supply potential setting circuit 30 is provided in an area extending along the second direction Dy in the peripheral area GA. FIG. 1 illustrates an example of providing the sensor power supply potential setting circuit 30 on a side of the sensor 10 opposite to the gate line drive circuit 15. However, the sensor power supply potential setting circuit 30 is not limited to this example, but may be provided in an area extending along the first direction Dx in the peripheral area GA in the same manner as the signal line selection circuit 16.

The first direction Dx is one direction in a plane parallel to the sensor base member 21. The second direction Dy is one direction in the plane parallel to the sensor base member 21 and is a direction orthogonal to the first direction Dx. The second direction Dy may non-orthogonally intersect the first direction Dx. A third direction Dz is a direction orthogonal to the first direction Dx and the second direction Dy and is a direction normal to the sensor base member 21.

The first light sources 61 are provided on the first light source base member 51 and are arranged along the second direction Dy. The second light sources 62 are provided on the second light source base member 52, and are arranged along the second direction Dy. The first light source base member 51 and the second light source base member 52 are electrically coupled, through terminals 124 and 125 provided on the control substrate 121, to the control circuit 122 and the power supply circuit 123.

For example, inorganic light-emitting diodes (LEDs) or organic electroluminescent (EL) diodes (organic light-emitting diodes (OLEDs)) are used as the first and the second light sources 61 and 62.

Light emitted from the first light sources 61 and the second light sources 62 is mainly reflected on a surface of or in an object to be detected, such as a finger Fg, and is incident on the sensor 10. As a result, the sensor 10 can detect a shape of asperities on the surface of the finger Fg or the like, and information on a living body in the finger Fg or the like. Examples of the information on the living body include pulse waves, pulsation, and a vascular image of the finger Fg or a palm. That is, the detection device 1 may be configured as a fingerprint detection device to detect a fingerprint or a vein detection device to detect a vascular pattern of, for example, veins.

In an aspect, light emitted from the first light sources 61 and light emitted from the second light sources 62 may have different wavelengths from each other. Thus, the detection device 1 can detect the various information on the living body by performing the detection based on the light emitted from the first light sources 61 and the detection based on the light emitted from the second light sources 62.

The arrangement of the first and the second light sources 61 and 62 illustrated in FIG. 1 is merely an example, and may be changed as appropriate. The detection device 1 is provided with a plurality of types of light sources (first and second light sources 61 and 62) as the light sources. However, the light sources are not limited thereto, and may be of one type. For example, the first and the second light sources 61 and 62 may be arranged on each of the first and the second light source base members 51 and 52. The first and the second light sources 61 and 62 may be provided on one light source base member, or three or more light source base members. Alternatively, only at least one light source needs to be disposed. The light source may be what is called a direct-type backlight that is provided directly below the detection area AA.

Figure 2:
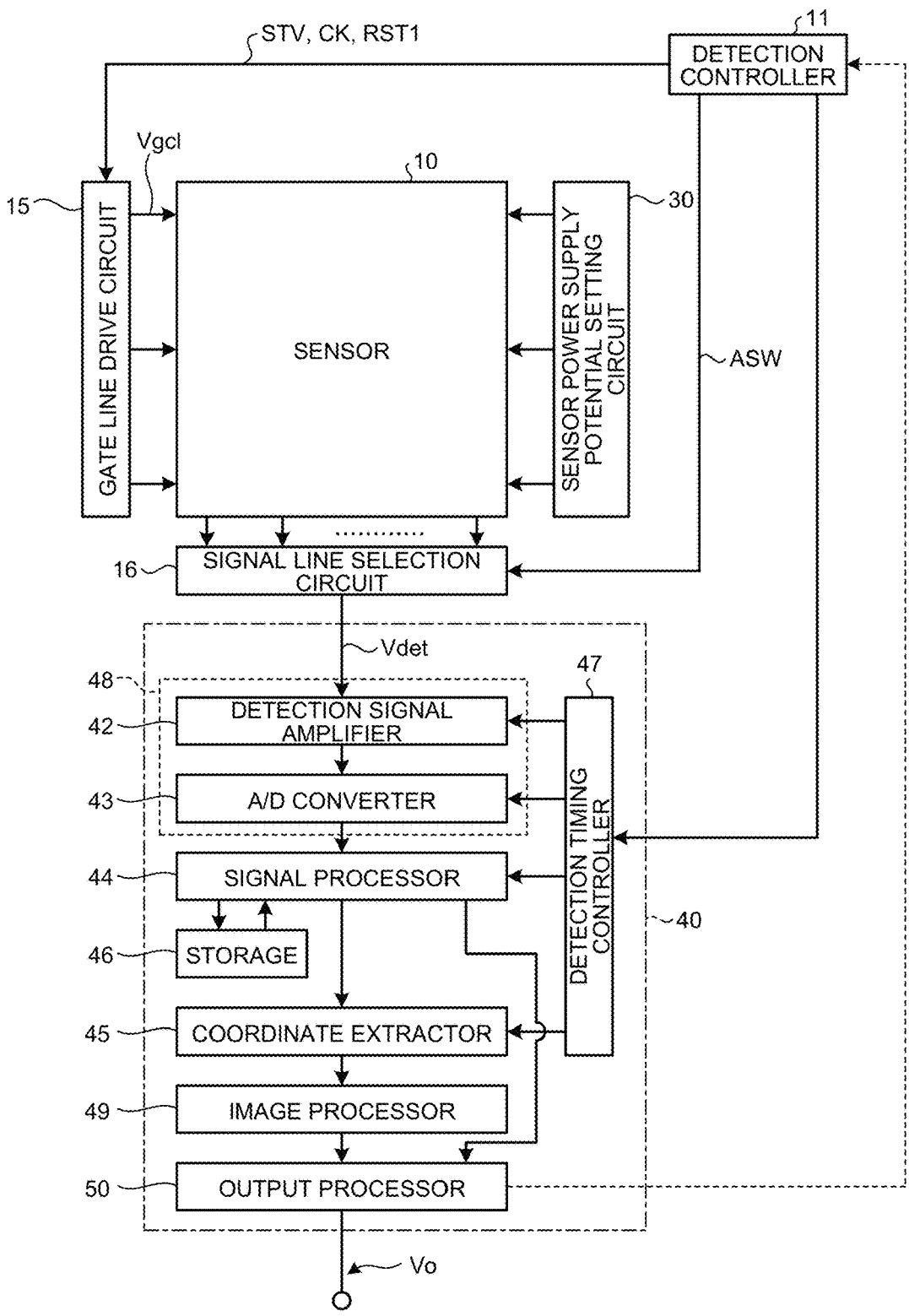
FIG. 2 is a block diagram illustrating a configuration example of the detection device according to the embodiment.

FIG. 2 is a block diagram illustrating a configuration example of the detection device according to the embodiment. As illustrated in FIG. 2, the detection device 1 further includes a detection controller (detection control circuit) 11 and a detector (detection signal processing circuit) 40. The control circuit 122 includes one, some, or all functions of the detection controller 11. The control circuit 122 also includes one, some, or all functions of the detector 40 other than those of the detection circuit 48.

Figure 4:
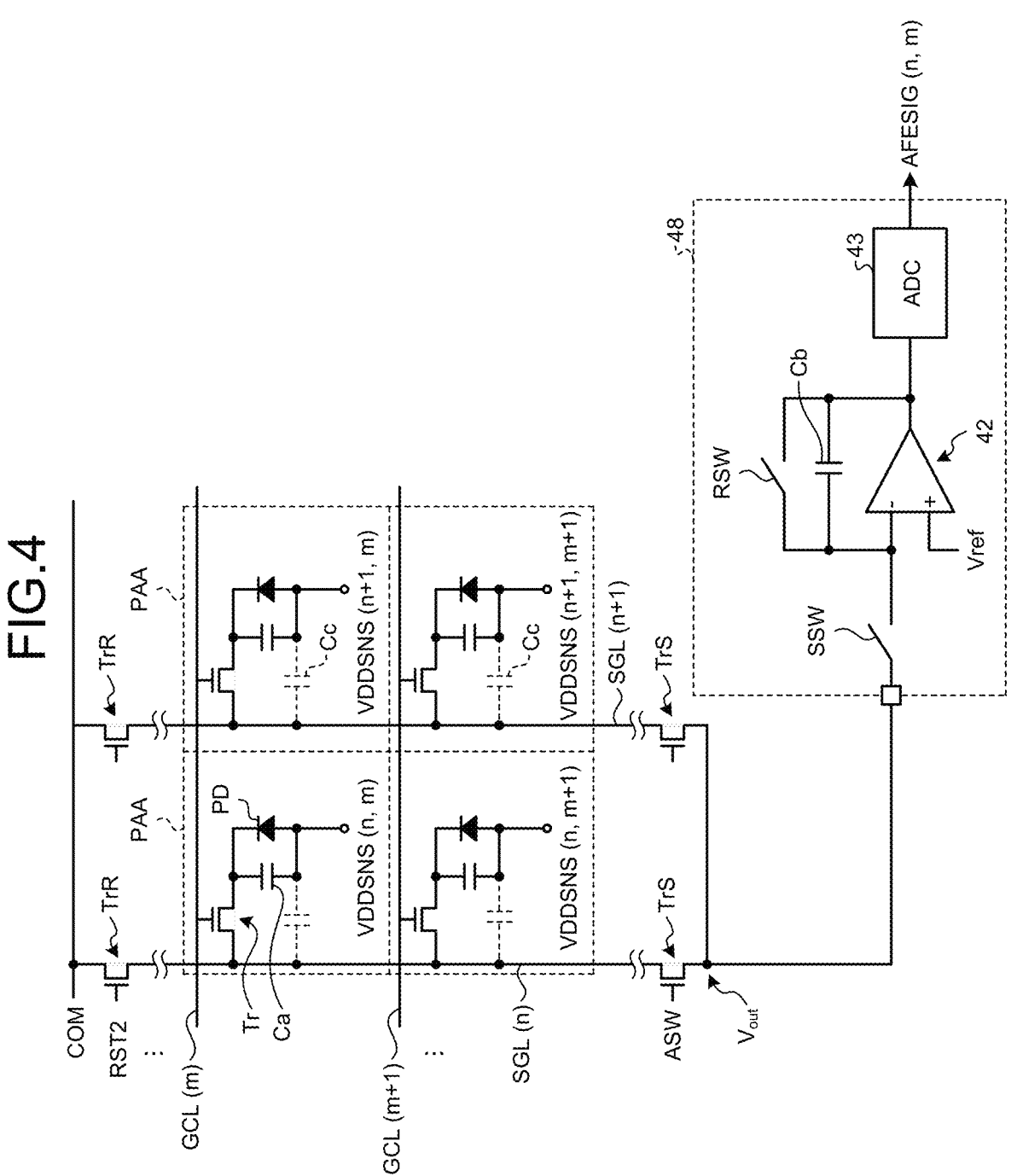
FIG. 4 is a circuit diagram illustrating a plurality of partial detection areas.

The sensor 10 includes the optical sensors PD (refer to FIG. 4). Each of the optical sensors PD is a photoelectric conversion element and outputs an electrical signal corresponding to light emitted thereto as a detection signal Vdet to the signal line selection circuit 16. In the present disclosure, the optical sensor PD is an organic photo diode (OPD). The sensor 10 performs the detection according to a gate drive signal Vgcl supplied from the gate line drive circuit 15.

The detection controller 11 is a circuit that supplies respective control signals to the gate line drive circuit 15, the signal line selection circuit 16, and the detector 40 to control operations of these components. The detection controller 11 supplies various control signals including, for example, a start signal STV, a clock signal CK, and a reset signal RST1 to the gate line drive circuit 15. The detection controller 11 also supplies various control signals including, for example, a selection signal ASW to the signal line selection circuit 16. The detection controller 11 also supplies various control signals to the first and the second light sources 61 and 62 to control the lighting and the non-lighting of each group of the first and the second light sources 61 and 62.

The gate line drive circuit 15 is a circuit that drives a plurality of gate lines GCL (refer to FIG. 3) based on the various control signals. The gate line drive circuit 15 sequentially or simultaneously selects the gate lines GCL, and supplies the gate drive signals Vgcl to the selected gate lines GCL. Through this operation, the gate line drive circuit 15 selects the optical sensors PD coupled to the gate lines GCL.

Figure 3:
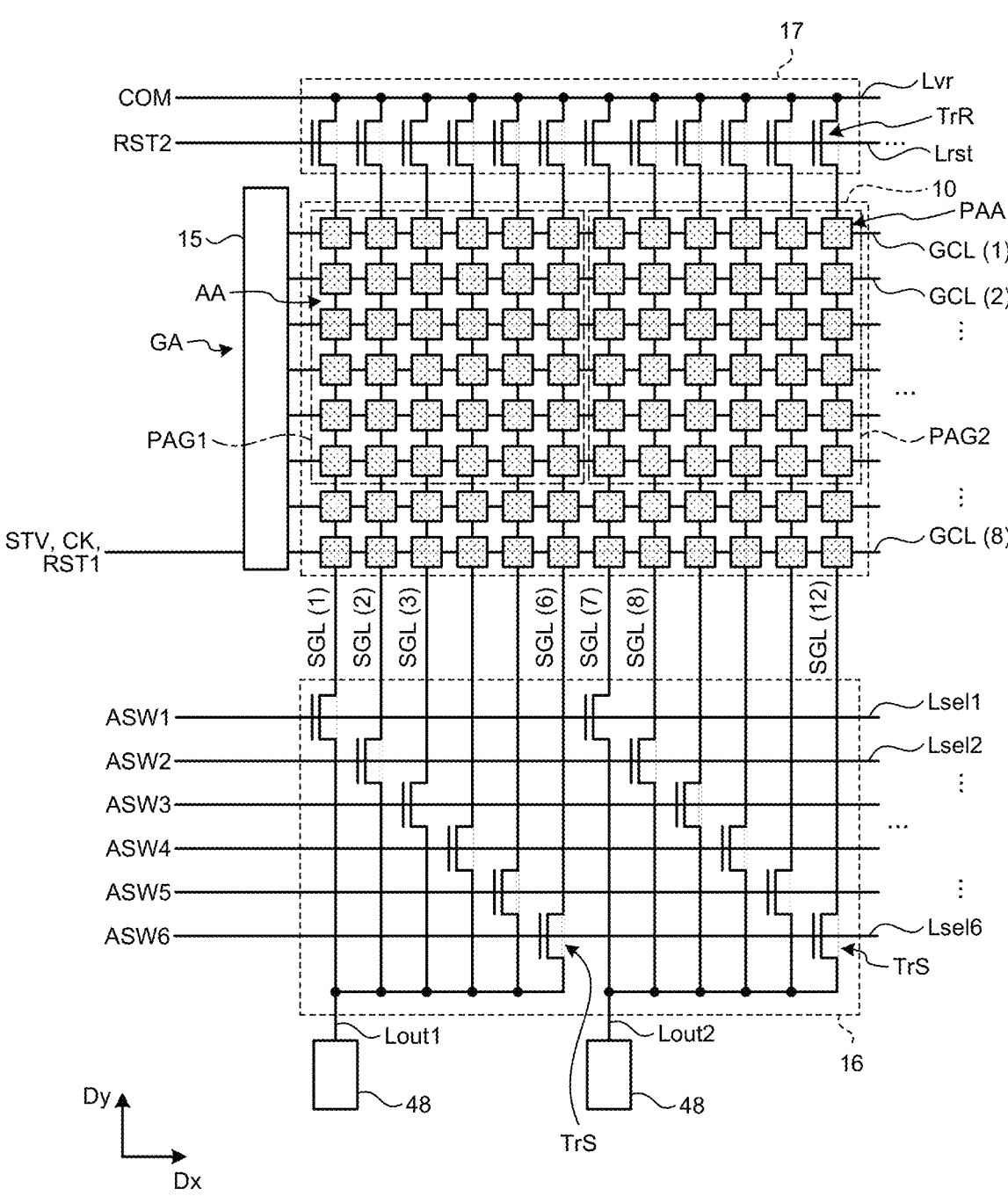
FIG. 3 is a circuit diagram illustrating the detection device.

The signal line selection circuit 16 is a switch circuit that sequentially or simultaneously selects a plurality of signal lines SGL (refer to FIG. 3). The signal line selection circuit 16 is, for example, a multiplexer. The signal line selection circuit 16 electrically couples the selected signal lines SGL to the detection circuit 48 based on the selection signal ASW supplied from the detection controller 11. By this operation, the signal line selection circuit 16 outputs the detection signals Vdet of the optical sensors PD to the detector 40.

The sensor power supply potential setting circuit 30 is a switch circuit that applies the sensor power supply VDDSNS to cause the optical sensor PD to be reverse-biased. The sensor power supply potential setting circuit 30 supplies the sensor power supply VDDSNS to each of the optical sensors PD based on a sensor power supply control signal VDDSNSCTRL to be described later.

In the present disclosure, the sensor power supply potential setting circuit 30 supplies, to the optical sensors PD, one of two types of a first sensor power supply potential (first potential) VDDSNS1 and a second sensor power supply potential (second potential) VDDSNS2 that have different voltage values from each other. A specific configuration example of the sensor power supply potential setting circuit 30 will be described later.

The detector 40 includes the detection circuit 48, a signal processor (signal processing circuit) 44, a coordinate extractor (coordinate extraction circuit) 45, a storage (storage circuit) 46, a detection timing controller (detection timing control circuit) 47, an image processor (image processing circuit) 49, and an output processor (output processing circuit) 50. Based on a control signal supplied from the detection controller 11, the detection timing controller 47 controls the detection circuit 48, the signal processor 44, the coordinate extractor 45, and the image processor 49 so as to operate in synchronization with one another.

The detection circuit 48 is, for example, an analog front-end (AFE) circuit. The detection circuit 48 is a signal processing circuit having functions of at least a detection signal amplifier 42 and an analog-to-digital (A/D) converter 43. The detection signal amplifier 42 amplifies the detection signal Vdet. The A/D converter 43 converts an analog signal output from the detection signal amplifier 42 into a digital signal and outputs an AFE signal AFESIG (to be described later).

The signal processor 44 is a logic circuit that detects a predetermined physical quantity received by the sensor 10 based on an output signal of the detection circuit 48. The signal processor 44 can detect the asperities on the surface of the finger Fg or the palm based on the signals from the detection circuit 48 when the finger Fg is in contact with or in proximity to a detection surface. The signal processor 44 can also detect the information on the living body based on the signals from the detection circuit 48. Examples of the information on the living body include the vascular image of the finger Fg or the palm, the pulse waves, the pulsation, and a blood oxygen level.

The signal processor 44 may also perform processing of acquiring the detection signals Vdet (information on the living body) simultaneously detected by the optical sensors PD, and averaging the detection signals Vdet. In this case, the detector 40 can perform stable detection by reducing measurement errors caused by noise or relative positional misalignment between the object to be detected, such as the finger Fg, and the sensor 10.

The signal processor 44 may further generate the sensor power supply control signal VDDSNSCTRL (to be described later) and supply it to the sensor power supply potential setting circuit 30.

The storage 46 temporarily stores therein signals calculated by the signal processor 44. The storage 46 may be, for example, a random-access memory (RAM) or a register circuit.

The coordinate extractor 45 is a logic circuit that obtains detected coordinates of the asperities on the surface of the finger or the like when the contact or the proximity of the finger is detected by the signal processor 44. The coordinate extractor 45 is the logic circuit that also obtains detected coordinates of blood vessels of the finger Fg or the palm. The image processor 49 combines the detection signals Vdet output from the respective optical sensors PD of the sensor 10 to generate two-dimensional information indicating the shape of the asperities on the surface of the finger Fg or the like and two-dimensional information indicating the shape of the blood vessels of the finger Fg or the palm. The coordinate extractor 45 may output the detection signals Vdet as sensor outputs Vo instead of calculating the detected coordinates. A case can be considered where the detector 40 does not include the coordinate extractor 45 and the image processor 49.

The output processor 50 serves as a processor that performs processing based on the outputs from the optical sensors PD. Specifically, the output processor 50 of the present embodiment outputs the sensor outputs Vo including at least pulse wave data based on at least the detection signals Vdet acquired through the signal processor 44. In the present embodiment, the signal processor 44 outputs data indicating a variation (amplitude) in output of the detection signal Vdet of each of the optical sensors PD (to be described later), and the output processor 50 determines which outputs are to be employed as the sensor outputs Vo. However, the signal processor 44 or the output processor 50 may perform both these operations. The output processor 50 may include, for example, the detected coordinates obtained by the coordinate extractor 45 and the two-dimensional information generated by the image processor 49 in the sensor outputs Vo. The function of the output processor 50 may be integrated into another component (for example, the image processor 49).

The following describes a circuit configuration example of the detection device 1. FIG. 3 is a circuit diagram illustrating the detection device. The following describes a circuit configuration when a detection process is performed.

As illustrated in FIG. 3, the sensor 10 has a plurality of partial detection areas PAA arranged in a matrix having a row-column configuration. Each of the partial detection areas PAA is provided with the optical sensor PD.

The gate lines GCL extend in the first direction Dx, and are each coupled to the partial detection areas PAA arranged in the first direction Dx. A plurality of gate lines GCL(1), GCL(2), . . . , GCL(8) are arranged in the second direction Dy, and are each coupled to the gate line drive circuit 15. In the following description, the gate lines GCL(1), GCL(2), . . . , GCL(8) will each be simply referred to as the gate line GCL when they need not be distinguished from one another. For ease of understanding of the description, FIG. 3 illustrates eight gate lines GCL. However, this is merely an example, and M gate lines GCL (where M is 8 or larger, and is, for example, 256) may be arranged. Specifically, for example, the number of the gate lines GCL is 168, but the number may be larger or smaller.

The signal lines SGL extend in the second direction Dy, and are each coupled to the optical sensors PD of the partial detection areas PAA arranged in the second direction Dy. A plurality of signal lines SGL(1), SGL(2), . . . , SGL(12) are arranged in the first direction Dx, and are each coupled to the signal line selection circuit 16 and a reset circuit 17. In the following description, the signal lines SGL(1), SGL(2), . . . , SGL(12) will each be simply referred to as the signal line SGL when they need not be distinguished from one another.

For ease of understanding of the description, FIG. 3 illustrates 12 signal lines SGL. However, this is merely an example, and N signal lines SGL (where N is 12 or larger, and is, for example, 252) may be arranged. Specifically, for example, the number of the signal lines SGL is 126, but the number may be larger or smaller.

In FIG. 3, the sensor 10 is provided between the signal line selection circuit 16 and the reset circuit 17. The present disclosure is not limited thereto. The signal line selection circuit 16 and the reset circuit 17 may be coupled to ends of the signal lines SGL in the same direction.

The gate line drive circuit 15 receives various control signals including, for example, the start signal STV, the clock signal CK, and the reset signal RST1 from the control circuit 122 (refer to FIG. 1). The gate line drive circuit 15 sequentially selects the gate lines GCL(1), GCL(2), . . . , GCL(8) in a time-division manner based on the various control signals. The gate line drive circuit 15 supplies the gate drive signal Vgcl to the selected one of the gate lines GCL. This operation supplies the gate drive signal Vgcl to a plurality of first switching elements Tr coupled to the gate line GCL, and thus selects corresponding ones of the partial detection areas PAA arranged in the first direction Dx as detection targets.

The gate line drive circuit 15 may perform different driving for each of detection modes including the detection of a fingerprint and the detection of different items of the information on the living body (such as the pulse waves, the pulsation, the vascular image, and the blood oxygen level). For example, the gate line drive circuit 15 may collectively drive more than one of the gate lines GCL.

The signal line selection circuit 16 includes a plurality of selection signal lines Lsel, a plurality of output signal lines Lout, and third switching elements TrS. The third switching elements TrS are provided correspondingly to the signal lines SGL. Six signal lines SGL(1), SGL(2), . . . , SGL(6) are coupled to a common output signal line Lout1. Six signal lines SGL(7), SGL(8), . . . , SGL(12) are coupled to a common output signal line Lout2. The output signal lines Lout1 and Lout2 are each coupled to the detection circuit 48.

The signal lines SGL(1), SGL(2), . . . , SGL(6) are grouped into a first signal line block, and the signal lines SGL(7), SGL(8), . . . , SGL(12) are grouped into a second signal line block. The selection signal lines Lsel are coupled to the gates of the respective third switching elements TrS included in one of the signal line blocks. One of the selection signal lines Lsel is coupled to the gates of the third switching elements TrS in the signal line blocks.

The control circuit 122 (refer to FIG. 1) sequentially supplies the selection signal ASW to the selection signal lines Lsel. This operation causes the signal line selection circuit 16 to operate the third switching elements TrS to sequentially select the signal lines SGL in one of the signal line blocks in a time-division manner. The signal line selection circuit 16 selects one of the signal lines SGL in each of the signal line blocks. With the above-described configuration, the detection device 1 can reduce the number of integrated circuits (ICs) including the detection circuit 48 or the number of terminals of the ICs. The signal line selection circuit 16 may collectively couple more than one of the signal lines SGL to the detection circuit 48.

As illustrated in FIG. 3, the reset circuit 17 includes a reference potential line Lvr, a reset signal line Lrst, and fourth switching elements TrR. The fourth switching elements TrR are provided correspondingly to the signal lines SGL. The reference potential line Lvr is coupled to either the sources or the drains of the fourth switching elements TrR. The reset signal line Lrst is coupled to the gates of the fourth switching elements TrR.

The control circuit 122 supplies a reset signal RST2 to the reset signal line Lrst. This operation turns on the fourth switching elements TrR to electrically couple the signal lines SGL to the reference potential line Lvr. The power supply circuit 123 supplies a reference potential COM to the reference potential line Lvr. This operation supplies the reference potential COM to a capacitive element Ca (refer to FIG. 4) included in each of the partial detection areas PAA. In the present disclosure, the reference potential COM is 0.75 V, for example.

FIG. 4 is a circuit diagram illustrating the partial detection areas. FIG. 4 also illustrates a circuit configuration of the detection circuit 48. As illustrated in FIG. 4, each of the partial detection areas PAA includes the optical sensor PD, the capacitive element Ca, and a corresponding one of the first switching elements Tr. The capacitive element Ca is capacitance (sensor capacitance) generated in the optical sensor PD, and is equivalently coupled in parallel to the optical sensor PD. In addition, signal line capacitance Cc is parasitic capacitance generated on each of the signal lines SGL and is equivalently generated between the signal line SGL and a node between the anode of the optical sensor PD and one end side of the capacitive element Ca.

FIG. 4 illustrates two gate lines GCL(m) and GCL(m+1) arranged in the second direction Dy among the gate lines GCL. FIG. 4 also illustrates two signal lines SGL(n) and SGL(n+1) arranged in the first direction Dx among the signal lines SGL. The partial detection area PAA is an area surrounded by the gate lines GCL and the signal lines SGL.

Each of the first switching elements Tr is provided correspondingly to the optical sensor PD. The first switching element Tr is formed of a thin-film transistor, and in this example, formed of an n-channel metal oxide semiconductor (MOS) thin-film transistor (TFT).

The gates of the first switching elements Tr belonging to the partial detection areas PAA arranged in the first direction Dx are coupled to each of the gate lines GCL. The sources of the first switching elements Tr belonging to the partial detection areas PAA arranged in the second direction Dy are coupled to each of the signal lines SGL. The drain of the first switching element Tr is coupled to the cathode of the optical sensor PD and the capacitive element Ca.

The anode of the optical sensor PD is supplied with the first sensor power supply potential VDDSNS1 or the second sensor power supply potential VDDSNS2 from the sensor power supply potential setting circuit 30. The signal line SGL, the cathode of the optical sensor PD, and the capacitive element Ca are supplied with the reference potential COM that serves as an initial potential of the signal line SGL and the capacitive element Ca from the power supply circuit 123.

In the present disclosure, the first sensor power supply potential VDDSNS1 is −1.25 V, for example. In the present disclosure, the second sensor power supply potential VDDSNS2 is −0.25 V, for example. In the present disclosure, the reference potential COM is, for example, 0.75 V, as described above. That is, the optical sensor PD is reverse-biased at 2.0 V that is the potential difference between the reference potential COM and the first sensor power supply potential VDDSNS1, or at 1.0 V that is the potential difference between the reference potential COM and the second sensor power supply potential VDDSNS2. In other words, a reverse bias voltage (first voltage) of 2.0 V is applied to the optical sensor PD by the potential difference between the reference potential COM and the first sensor power supply potential (first potential) VDDSNS1. Alternatively, a reverse bias voltage (second voltage) of 1.0 V is applied to the optical sensor PD by the potential difference between the reference potential COM and the second sensor power supply potential (second potential) VDDSNS2.

When the partial detection area PAA is irradiated with light, a current corresponding to the amount of the light flows to the optical sensor PD. As a result, an electric charge is stored in the capacitive element Ca. After the first switching element Tr is turned on, a current corresponding to the electric charge stored in the capacitive element Ca flows through the signal line SGL. The signal line SGL is coupled to the detection circuit 48 through a corresponding one of the third switching elements TrS of the signal line selection circuit 16. Thus, the detection device 1 can detect a signal corresponding to the amount of the light irradiating the optical sensor PD for each of the partial detection areas PAA or for each block unit PAG.

During the read period Pdet (refer to FIG. 6), a switch SSW of the detection circuit 48 is turned on to couple the detection circuit 48 to the signal lines SGL. The detection signal amplifier 42 of the detection circuit 48 converts a current supplied from the signal line SGL into a voltage corresponding to the value of the current, and amplifies the result. A reference potential (Vref) having a fixed potential is supplied to a non-inverting input terminal (+) of the detection signal amplifier 42, and the signal lines SGL are coupled to an inverting input terminal (−) of the detection signal amplifier 42. In the present embodiment, the same signal as the reference signal COM is supplied as the reference potential (Vref) voltage. The detection signal amplifier 42 includes a capacitive element Cb and a reset switch RSW. During a reset period Prst (refer to FIG. 6), the reset switch RSW is turned on, and the electric charge of the capacitive element Cb is reset.

Figure 5A:
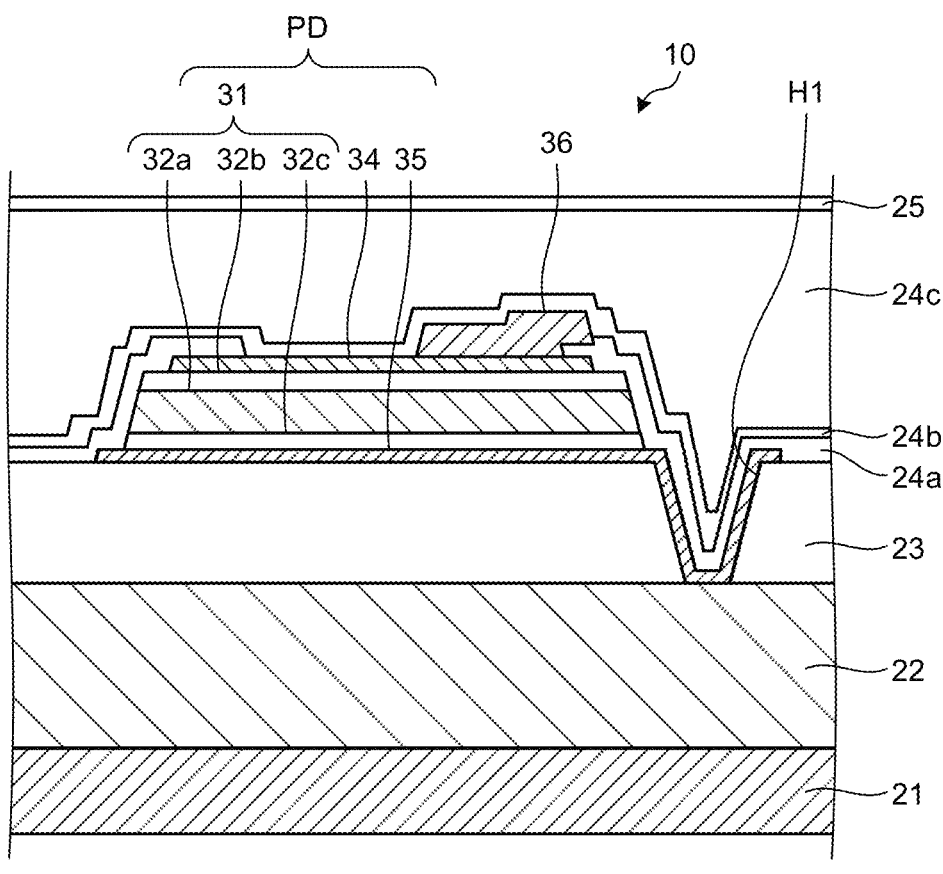
FIG. 5A is a sectional view illustrating a schematic sectional configuration of a sensor.

The following describes a configuration of the optical sensor PD. FIG. 5A is a sectional view illustrating a schematic sectional configuration of the sensor. As illustrated in FIG. 5A, the sensor 10 includes the sensor base member 21, a TFT layer 22, an insulating layer 23, the optical sensor PD, and insulating layers 24a, 24b, 24c, and 25. The sensor base member 21 is an insulating base member, and is made using, for example, glass or a resin material. The sensor base member 21 is not limited to having a flat plate shape, but may have a curved surface. In this case, the sensor base member 21 can be a film-like resin. The sensor base member 21 has a first surface and a second surface opposite to the first surface. The TFT layer 22, the insulating layer 23, the optical sensor PD, and the insulating layers 24 and 25 are stacked in this order on the first surface.

The TFT layer 22 is provided with circuits such as the gate line drive circuit 15 and the signal line selection circuit 16 described above. The TFT layer 22 is also provided with TFTs, such as the first switching elements Tr, and various types of wiring, such as the gate lines GCL and the signal lines SGL. The sensor base member 21 and the TFT layer 22 serve as a drive circuit board that drives the sensor for each predetermined detection area and are also called a backplane or an array substrate.

The insulating layer 23 is an organic insulating layer, and is provided on the TFT layer 22. The insulating layer 23 is a planarizing layer that planarizes asperities formed by the first switching elements Tr and various conductive layers formed in the TFT layer 22.

The optical sensor PD is provided on the insulating layer 23. The optical sensor PD includes a lower electrode 35, a semiconductor layer 31, and an upper electrode 34, which are stacked in this order.

The lower electrode 35 is provided on the insulating layer 23, and is electrically coupled to the first switching element Tr in the TFT layer 22 through a contact hole H1. The lower electrode 35 is the cathode of the optical sensor PD, and is an electrode for reading the detection signal Vdet. The lower electrode 35 is made of a light-transmitting conductive material such as indium tin oxide (ITO).

The semiconductor layer 31 is formed of amorphous silicon (a-Si). The semiconductor layer 31 includes an i-type semiconductor layer 32a, a p-type semiconductor layer 32b, and an n-type semiconductor layer 32c. The i-type semiconductor layer 32a, the p-type semiconductor layer 32b, and the n-type semiconductor layer 32c constitute a specific example of a photoelectric conversion element. In FIG. 5A, the n-type semiconductor layer 32c, the i-type semiconductor layer 32a, and the p-type semiconductor layer 32b are stacked in this order in a direction orthogonal to a surface of the sensor base member 21. However, the semiconductor layer 31 may have a reversed configuration, that is, the p-type semiconductor layer 32b, the i-type semiconductor layer 32a, and the n-type semiconductor layer 32c may be stacked in this order. In this case, the first sensor power supply potential VDDSNS1 is 2.75 V, for example. The semiconductor layer 31 may be a photoelectric conversion element formed of organic semiconductors.

The a-Si of the n-type semiconductor layer 32c is doped with impurities to form an n+ region. The a-Si of the p-type semiconductor layer 32b is doped with impurities to form a p+ region. The i-type semiconductor layer 32a is, for example, a non-doped intrinsic semiconductor, and has lower conductivity than that of the p-type semiconductor layer 32b and the n-type semiconductor layer 32c.

The upper electrode 34 is the anode of the optical sensor PD and is an electrode for supplying the first sensor power supply potential VDDSNS1 or the second sensor power supply potential VDDSNS2 to a photoelectric conversion layer. A metal material such as silver (Ag) or aluminum (Al), or indium zinc oxide (IZO) is used as the upper electrode 34. Alternatively, the upper electrode 34 may be a multilayered film formed by stacking a plurality of layers of silver (Ag) and other materials.

The insulating layers 24a and 24b are provided on the insulating layer 23. The insulating layer 24a covers the periphery of the upper electrode 34, and is provided with an opening in a position overlapping the upper electrode 34. Coupling wiring 36 is coupled to the upper electrode 34 at a portion of the upper electrode 34 not provided with the insulating layer 24a. The insulating layer 24b is provided on the insulating layer 24a so as to cover the upper electrode 34 and the coupling wiring 36. The insulating layer 24c serving as a planarizing layer is provided on the insulating layer 24b. The insulating layer 25 is provided on the insulating layer 24c. However, the insulating layer 25 need not be provided.

Figure 5B:
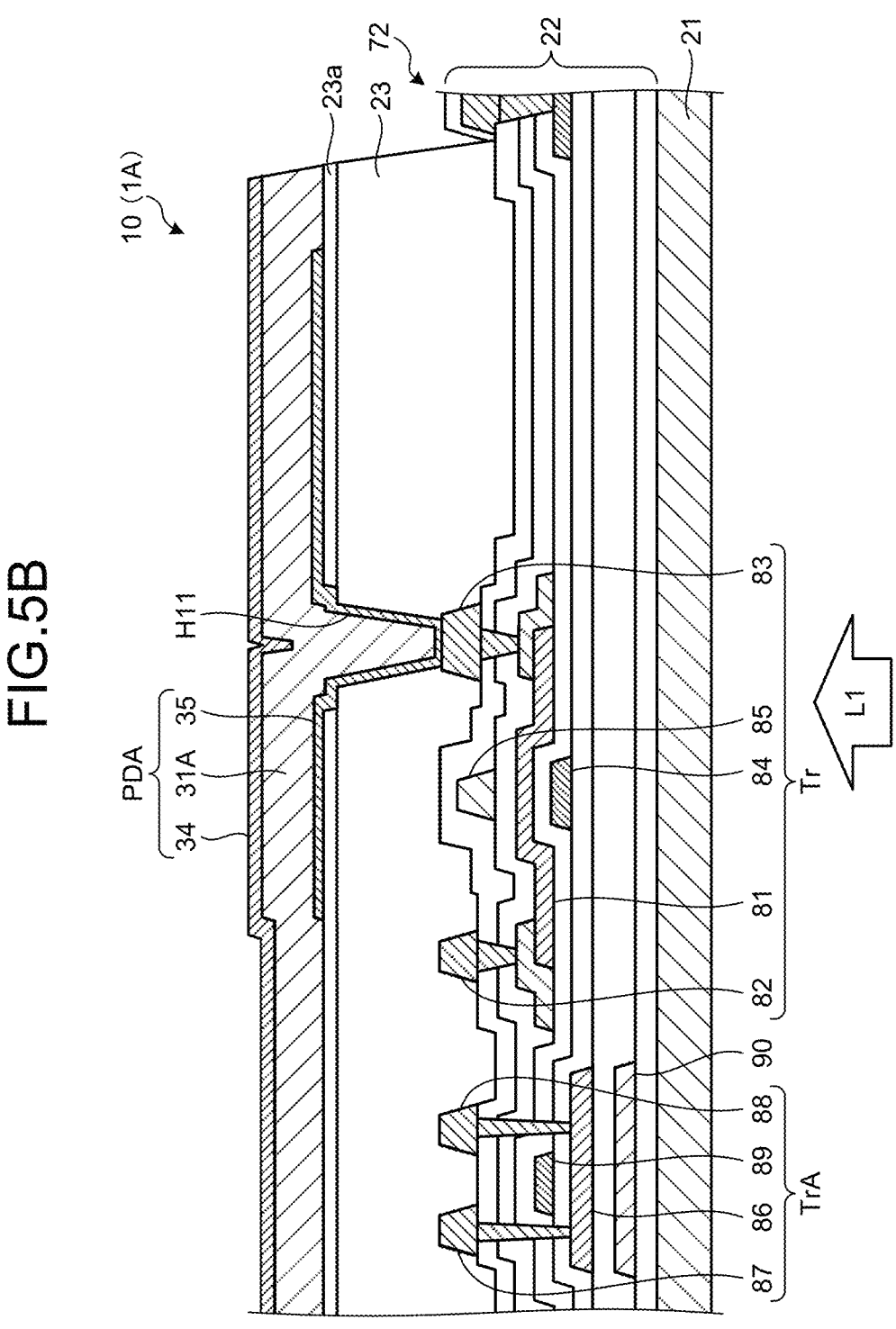
FIG. 5B is a sectional view illustrating a schematic sectional configuration of the sensor of a detection device according to a first modification.

FIG. 5B is a sectional view illustrating a schematic sectional configuration of the sensor of a detection device according to a first modification. As illustrated in FIG. 5B, in a detection device 1A of the first modification, an optical sensor PDA is provided above an insulating layer 23a. The insulating layer 23a is an inorganic insulating layer provided so as to cover the insulating layer 23, and is formed of silicon nitride (SiN), for example. The optical sensor PDA includes a photoelectric conversion layer 31A, the lower electrode 35 (cathode electrode), and the upper electrode 34 (anode electrode). The lower electrode 35, the photoelectric conversion layer 31A, and the upper electrode 34 are stacked in this order in a direction orthogonal to a first surface S1 of the sensor base member 21.

The photoelectric conversion layer 31A changes in characteristics (for example, voltage-current characteristics and resistance value) depending on light emitted thereto. An organic material is used as a material of the photoelectric conversion layer 31A. Specifically, as the photoelectric conversion layer 31A, low-molecular-weight organic materials can be used, such as fullerene ($C_{60}$), phenyl-$C_{61}$-butyric acid methyl ester (PCBM), copper phthalocyanine (CuPc), fluorinated copper phthalocyanine ($F_{16}$CuPc), 5,6,11,12-tetraphenyltetracene (rubrene), and perylene diimide (PDI) (derivative of perylene).

The photoelectric conversion layer 31A can be formed by a vapor deposition process (dry process) using the low-molecular-weight organic materials listed above. In this case, the photoelectric conversion layer 31A may be, for example, a multilayered film of CuPc and $F_{16}$CuPc, or a multilayered film of rubrene and $C_{60}$. The photoelectric conversion layer 31A can also be formed by a coating process (wet process). In this case, the photoelectric conversion layer 31A is made using a material obtained by combining the above-listed low-molecular-weight organic materials with high-molecular-weight organic materials. As the high-molecular-weight organic materials, for example, poly(3-hexylthiophene) (P3HT) and F8-alt-benzothiadiazole (F8BT) can be used. The photoelectric conversion layer 31A can be a film in the state of a mixture of P3HT and PCBM, or a film in the state of a mixture of F8BT and PDI.

The lower electrode 35 faces the upper electrode 34 with the photoelectric conversion layer 31A interposed therebetween. A metal material such as silver (Ag) or aluminum (Al) is used as the upper electrode 34. Alternatively, the lower electrode 35 may be an alloy material containing at least one or more of these metal materials. A light-transmitting conductive material such as ITO is used as the lower electrode 35.

The lower electrode 35 can be formed as a light-transmitting transflective electrode by controlling the film thickness of the lower electrode 35. For example, the lower electrode 35 is formed of a thin Ag film having a thickness of 10 nm so as to have light transmittance of approximately 60%. In this case, the optical sensor PDA can detect light emitted from both sides of the sensor base member 21, for example, both light Li emitted from the first surface S1 side and light emitted from a second surface S2 side.

Although not illustrated in FIG. 5B, a protective film 24 may be provided so as to cover the upper electrode 34. The protective film is a passivation film of, for example, a low-temperature (LT) silicon nitride (SiNx) or an aluminum oxide (AlOx), and is provided to protect the optical sensor PDA.

As illustrated in FIG. 5B, the TFT layer 22 is provided with the first switching element Tr electrically coupled to the optical sensor PDA. The first switching element Tr includes a semiconductor layer 81, a source electrode 82, a drain electrode 83, and gate electrodes 84 and 85. The lower electrode 35 of the optical sensor PDA is electrically coupled to the drain electrode 83 of the first switching element Tr through a contact hole H11 provided in the insulating layers 23 and 23a.

The first switching element Tr has what is called a dual-gate structure provided with the gate electrodes 84 and 85 on the upper and lower sides of the semiconductor layer 81. However, the first switching element Tr is not limited to this structure, and may have a top-gate structure or a bottom-gate structure.

FIG. 5B schematically illustrates a second switching element TrA and a terminal 72 that are provided in the peripheral area GA. The second switching element TrA is, for example, a switching element provided in the gate line drive circuit 15 (refer to FIG. 1). The second switching element TrA includes a semiconductor layer 86, a source electrode 87, a drain electrode 88, and a gate electrode 89. The second switching element TrA has what is called a top-gate structure provided with the gate electrode 89 on the upper side of the semiconductor layer 86. A light-blocking layer 90 is provided between the semiconductor layer 86 and the sensor base member 21 on the lower side of the semiconductor layer 86. The second switching element TrA is, however, not limited to this structure, and may have a bottom-gate structure or a dual-gate structure.

The semiconductor layer 81 of the first switching element Tr is provided in a layer different from that of the semiconductor layer 86 of the second switching element TrA. The semiconductor layer 81 of the first switching element Tr is formed of an oxide semiconductor, for example. The semiconductor layer 86 of the second switching element TrA is formed of polysilicon, for example.

Figure 6:
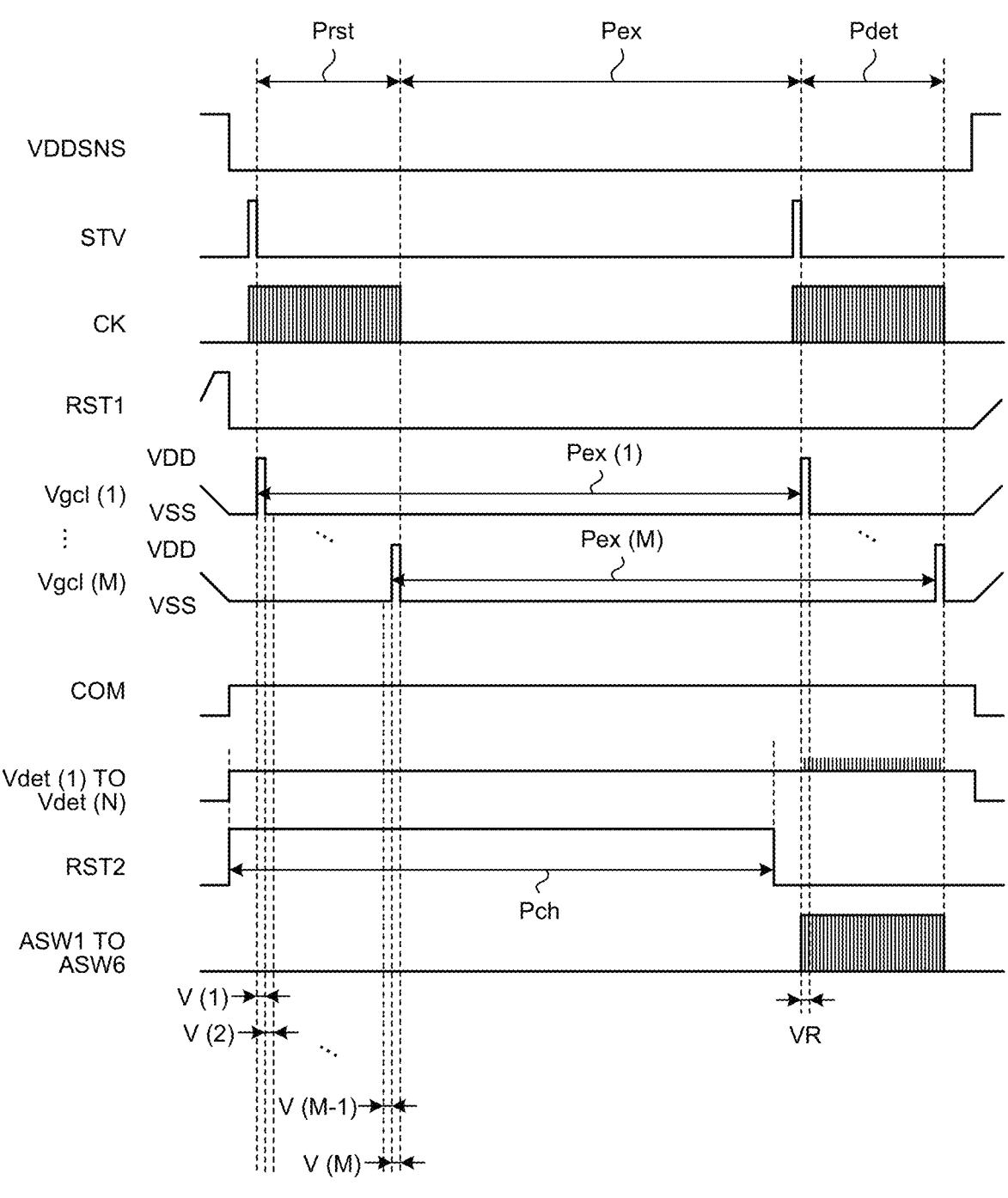
FIG. 6 is a waveform timing chart illustrating an exemplary detection operation of the detection device.
Figure 7:
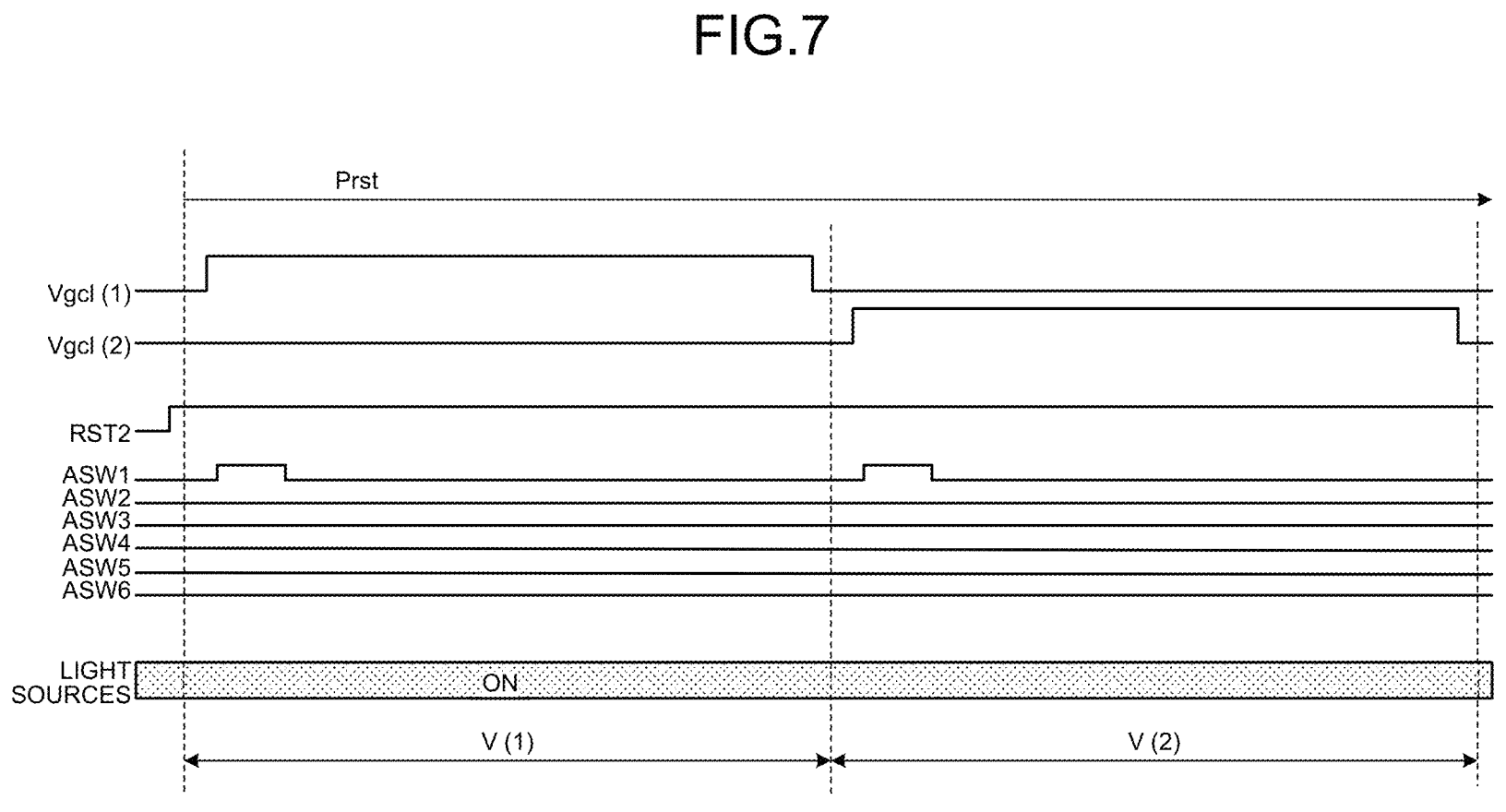
Figure 8:
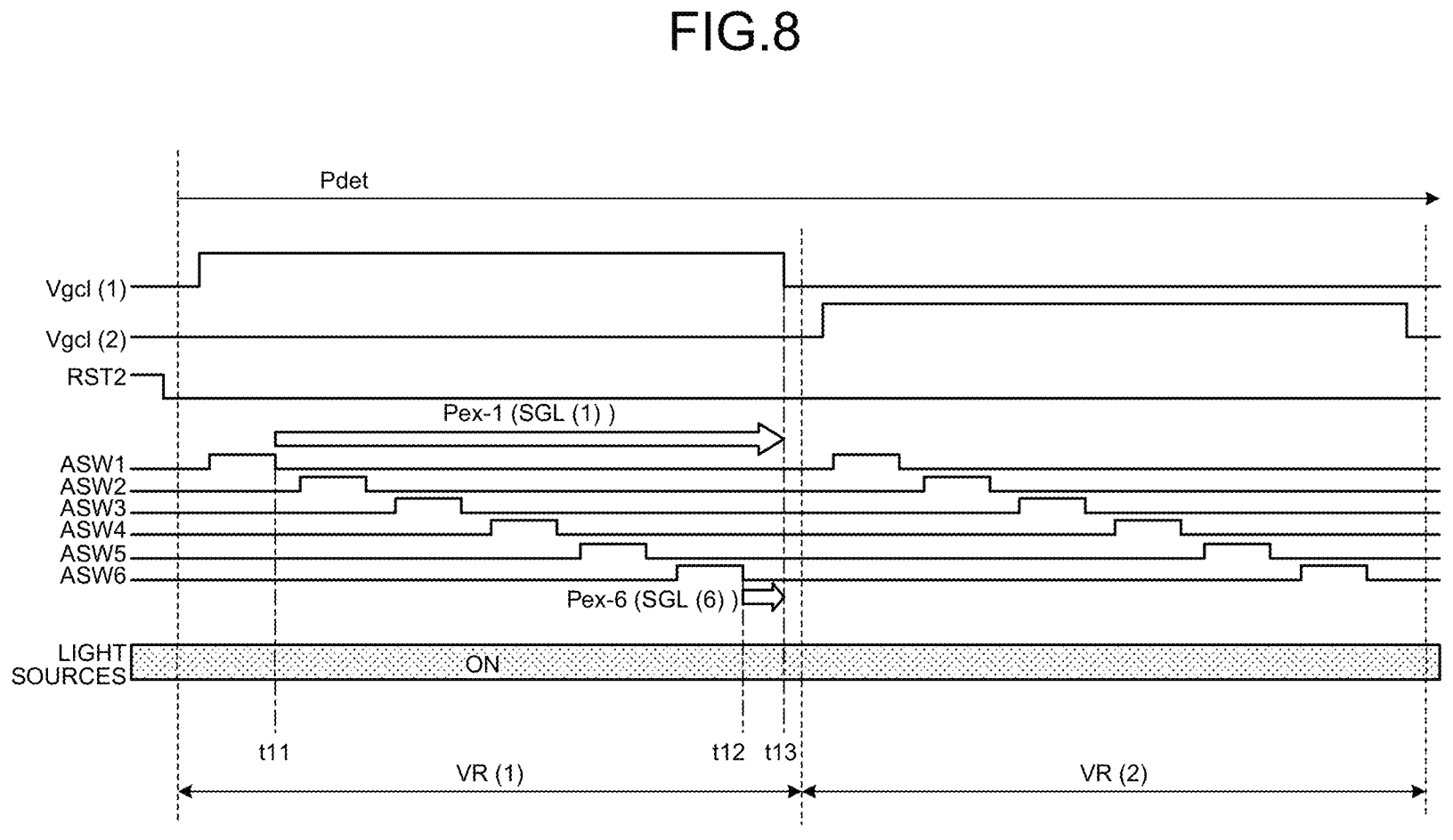
Figure 9:
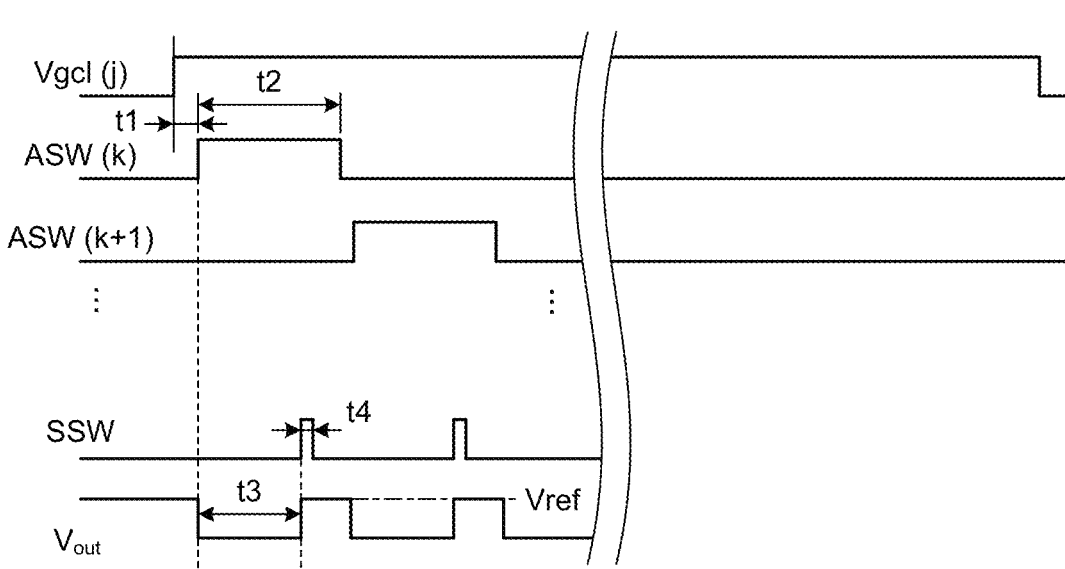
FIG. 9 is a waveform timing chart illustrating an operation example during a drive period of one gate line included in the read period in FIG. 6.
Figure 10:
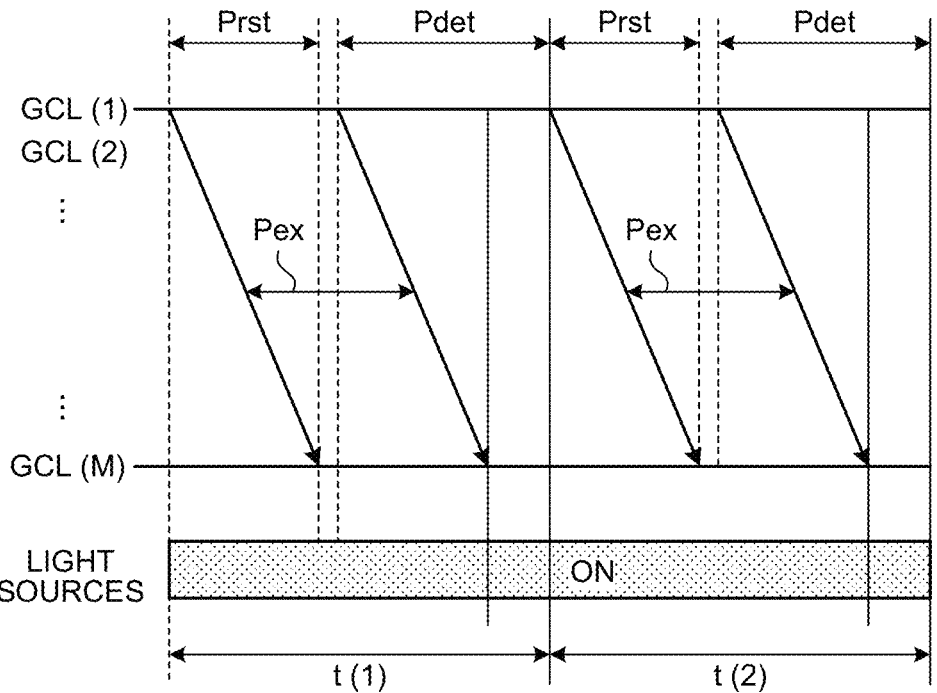
FIG. 10 is an explanatory chart for explaining a relation between driving of the sensor and a lighting operation of light sources in the detection device.

The following describes an operation example of the detection device 1 of the present embodiment. FIG. 6 is a waveform timing chart illustrating an exemplary detection operation of the detection device. FIG. 7 is a waveform timing chart illustrating an operation example during the reset period in FIG. 6. FIG. 8 is a waveform timing chart illustrating an operation example during the read period in FIG. 6. FIG. 9 is a waveform timing chart illustrating an operation example during a drive period of one gate line included in a row read period VR in FIG. 6. FIG. 10 is an explanatory chart for explaining a relation between driving of the sensor and a lighting operation of the light sources in the detection device.

As illustrated in FIG. 6, the detection device 1 has the reset period Prst, an exposure period Pex, and the read period Pdet. The sensor power supply potential setting circuit 30 supplies the first sensor power supply potential VDDSNS1 or the second sensor power supply potential VDDSNS2 to the anode of the optical sensor PD over the reset period Prst, the exposure period Pex, and the read period Pdet. The detection device 1 assumes the detection operation illustrated in FIG. 6 as one frame, and repeats the detection operation of the frame a plurality of times to detect the object to be detected in the detection area AA. Hereafter, the period during which the object to be detected is detected in the detection device 1 is also called "detection period".

The first sensor power supply potential VDDSNS1 or the second sensor power supply potential VDDSNS2 is a signal for applying a reverse bias between the anode and the cathode of the optical sensor PD. For example, the reference potential COM of substantially 0.75 V is applied to the cathode of the optical sensor PD, and the first sensor power supply potential VDDSNS1 of substantially −1.25 V is applied to the anode thereof. As a result, a reverse bias of substantially 2.0 V is applied between the anode and the cathode. In addition, by applying the second sensor power supply potential VDDSNS2 of substantially −0.25 V to the anode, a reverse bias of substantially 1.0 V is applied between the anode and the cathode. In other words, the reverse bias voltage (first voltage) of substantially 2.0 V is applied between the anode and the cathode of the optical sensor PD by the potential difference between the reference potential COM of substantially 0.75 V and the first sensor power supply potential (first potential) VDDSNS1 of substantially −1.25 V. In addition, the reverse bias voltage (second voltage) of substantially 1.0 V is applied to the optical sensor PD by the potential difference between the reference potential COM of substantially 0.75 V and the second sensor power supply potential (second potential) VDDSNS2 of substantially −0.25 V.

The control circuit 122 sets the reset signal RST2 to "H", and then, supplies the start signal STV and the clock signal CK to the gate line drive circuit 15 to start the reset period Prst. During the reset period Prst, the control circuit 122 supplies the reference potential COM to the reset circuit 17, and uses the reset signal RST2 to turn on the fourth switching elements TrR for supplying a reset voltage. This operation supplies the reference potential COM as the reset voltage to each of the signal lines SGL. The reference potential COM is set to, for example, 0.75 V, as described above.

During the reset period Prst, the gate line drive circuit 15 sequentially selects each of the gate lines GCL based on the start signal STV, the clock signal CK, and the reset signal RST1. The gate line drive circuit 15 sequentially supplies gate drive signals Vgcl {Vgcl(1), . . . Vgcl(M)} to the gate lines GCL. Each of the gate drive signals Vgcl has a pulsed waveform having a power supply voltage VDD serving as a high-level voltage and a power supply voltage VSS serving as a low-level voltage. In FIG. 6, M gate lines GCL (where M is, for example, 256) are provided, and the gate drive signals Vgcl(1), . . . , Vgcl(M) are sequentially supplied to the respective gate lines GCL. Thus, the first switching elements Tr are sequentially brought into a conducting state and supplied with the reset voltage on a row-by-row basis. For example, a voltage of 0.75 V of the reference potential COM is supplied as the reset voltage.

Specifically, as illustrated in FIG. 7, the gate line drive circuit 15 supplies the gate drive signal Vgcl(1) at the high-level voltage (power supply voltage VDD) to the gate line GCL(1) during a period V(1). The control circuit 122 supplies any one of selection signals ASW1, . . . , ASW6 (selection signal ASW1 in FIG. 7) to the signal line selection circuit 16 during a period in which the gate drive signal Vgcl(1) is at the high-level voltage (power supply voltage VDD). This operation couples the signal line SGL of the partial detection area PAA selected by the gate drive signal Vgcl(1) to the detection circuit 48. As a result, the reset voltage (reference potential COM) is also supplied to coupling wiring between the third switching element TrS and the detection circuit 48.

In the same manner, the gate line drive circuit 15 supplies the gate drive signals Vgcl(2), . . . , Vgcl(M−1), Vgcl(M) at the high-level voltage to gate lines GCL(2), GCL(M−1), GCL(M) during periods V(2), . . . , V(M−1), V(M), respectively.

Thus, during the reset period Prst, the capacitive elements Ca of all the partial detection areas PAA are sequentially electrically coupled to the signal lines SGL, and are supplied with the reference potential COM. As a result, the capacitive elements Ca are reset. The capacitance of the capacitive elements Ca of some of the partial detection areas PAA can be reset by partially selecting the gate lines and the signal lines SGL.

Examples of the method of controlling the exposure include a method of controlling the exposure during non-selection of the gate lines and a method of always controlling the exposure. In the method of controlling the exposure during non-selection of the gate lines, the gate drive signals {Vgcl(1), . . . , Vgcl(M)} are sequentially supplied to all the gate lines GCL coupled to the optical sensors PD serving as the detection targets, and all the optical sensors PD serving as the detection targets are supplied with the reset voltage. Then, after all the gate lines GCL coupled to the optical sensors PD serving as the detection targets are set to a low voltage (the first switching elements Tr are turned off), the exposure starts and the exposure is performed during the exposure period Pex.

After the exposure ends, the gate drive signals {Vgcl(1), . . . , Vgcl(M)} are sequentially supplied to the gate lines GCL coupled to the optical sensors PD serving as the detection targets as described above, and reading is performed during the read period Pdet. In the method of always controlling the exposure, the control for performing the exposure can also be performed during the reset period Prst and the read period Pdet (the exposure is always controlled). In this case, each of the actual exposure periods Pex(1) . . . Pex(M) starts after a corresponding one of the gate drive signals Vgcl(1) . . . Vgcl(M) is supplied to a corresponding one of the gate lines GCL(1) . . . GCL(M) and the corresponding gates are turned off during the reset period Prst.

The exposure periods Pex {(1), . . . , (M)} are periods during which the capacitive elements Ca are charged from the optical sensors PD. The electric charge stored in the capacitive element Ca during the reset period Prst causes a reverse directional current (from cathode to anode) to flow through the optical sensor PD due to light irradiation, and the potential difference in the capacitive element Ca decreases. The start timing and the end timing of the actual exposure periods Pex(1), . . . , Pex(M) are different among the partial detection areas PAA corresponding to the respective gate lines GCL.

Each of the exposure periods Pex(1), . . . , Pex(M) starts when the gate drive signal Vgcl changes from the power supply voltage VDD serving as the high-level voltage to the power supply voltage VSS serving as the low-level voltage during the reset period Prst. Each of the exposure periods Pex(1), . . . , Pex(M) ends when the gate drive signal Vgcl changes from the power supply voltage VSS to the power supply voltage VDD during the read period Pdet. The lengths of the exposure time of the exposure periods Pex(1), . . . , Pex(M) are equal.

In the method of controlling the exposure during non-selection of the gate lines, a current flows correspondingly to the light irradiating the optical sensor PD of each of the partial detection areas PAA during the exposure periods Pex {(1), . . . , (M)}. As a result, an electric charge is stored in each of the capacitive elements Ca.

At a time before the read period Pdet starts, the control circuit 122 sets the reset signal RST2 to a low-level voltage. This operation stops the operation of the reset circuit 17. The reset signal may be set to a high-level voltage only during the reset period Prst. During the read period Pdet, the gate line drive circuit 15 sequentially supplies the gate drive signals Vgcl(1), . . . , Vgcl(M) to the gate lines GCL in the same manner as during the reset period Prst.

Specifically, as illustrated in FIG. 8, the gate line drive circuit 15 supplies the gate drive signal Vgcl(1) at the high-level voltage (power supply voltage VDD) to the gate line GCL(1) during a row read period VR(1). The control circuit 122 sequentially supplies the selection signals ASW1, . . . , ASW6 to the signal line selection circuit 16 during a period in which the gate drive signal Vgcl(1) is at the high-level voltage (power supply voltage VDD). This operation sequentially or simultaneously couples the signal lines SGL of the partial detection areas PAA selected by the gate drive signal Vgcl(1) to the detection circuit 48. As a result, the detection signal Vdet for each of the partial detection areas PAA is supplied to the detection circuit 48.

In the same manner, the gate line drive circuit 15 supplies the gate drive signals Vgcl(2), . . . , Vgcl(M−1), Vgcl(M) at the high-level voltage to the gate lines GCL(2), . . . , GCL(M−1), GCL(M) during row read periods VR(2), . . . , VR(M−1), VR(M), respectively. That is, the gate line drive circuit 15 supplies the gate drive signal Vgcl to the gate line GCL during each of the row read periods VR(1), VR(2), . . . , VR(M−1), VR(M). The signal line selection circuit 16 sequentially selects each of the signal lines SGL based on the selection signal ASW in each period in which the gate drive signal Vgcl is set to the high-level voltage. The signal line selection circuit 16 sequentially couples each of the signal lines SGL to one detection circuit 48. Thus, the detection device 1 can output the detection signals Vdet of all the partial detection areas PAA to the detection circuit 48 during the read period Pdet.

With reference to FIG. 9, the following describes an operation example during the row read period VR that is a supply period of one gate drive signal Vgcl(j) in FIG. 6. In FIG. 6, the reference numeral of the row read period VR is assigned to the first gate drive signal Vgcl(1). The same also applies to the other gate drive signals Vgcl(2), . . . , Vgcl(M). The index j is any one of the natural numbers 1 to M.

As illustrated in FIGS. 9 and 4, an output (Vout) of each of the third switching elements TrS has been reset to the reference potential (Vref) voltage in advance. The reference potential (Vref) voltage serves as the reset voltage, and is set to 0.75 V, for example. Then, the gate drive signal Vgcl(j) is set to a high level, and the first switching elements Tr of a corresponding row are turned on. Thus, each of the signal lines SGL in each row is set to a voltage corresponding to the electric charge stored in the capacitor (capacitive element Ca) of the partial detection area PAA.

After a period t1 elapses from a rising edge of the gate drive signal Vgcl(j), a period t2 starts in which the selection signal ASW(k) is set to a high level. After the selection signal ASW(k) is set to the high level to turn on the third switching element TrS, the electric charge stored in the capacitor (capacitive element Ca) of the partial detection area PAA coupled to the detection circuit 48 through the third switching element TrS changes the output (Vout) of the third switching element TrS (refer to FIG. 4) to a voltage corresponding to the electric charge stored in the capacitor (capacitive element Ca) of the partial detection area PAA (in a period t3). In the example of FIG. 9, this voltage is reduced from the reset voltage as illustrated in the period t3.

Then, after the switch SSW is turned on (in a period t4 during which an SSW signal is set to a high level), the electric charge stored in the capacitor (capacitive element Ca) of the partial detection area PAA moves to the capacitor (capacitive element Cb) of the detection signal amplifier 42 of the detection circuit 48, and the output voltage of the detection signal amplifier 42 is set to a voltage corresponding to the electric charge stored in the capacitive element Cb. At this time, the potential of the inverting input portion of the detection signal amplifier 42 is set to a virtual short-circuit potential of an operational amplifier, and therefore, becomes the reference potential (Vref). The A/D converter 43 reads the output voltage of the detection signal amplifier 42.

In the example of FIG. 9, waveforms of the selection signals ASW(k), ASW(k+1), . . . corresponding to the signal lines SGL of the respective columns are set to a high level to sequentially turn on the third switching elements TrS, and the same operation is sequentially performed to sequentially read the electric charges stored in the capacitors (capacitive elements Ca) of the partial detection areas PAA coupled to the gate line GCL. ASW(k), ASW(k+1), . . . in FIG. 9 are, for example, any of ASW1 to ASW6 in FIG. 8.

Specifically, when the period t4 starts in which the switch SSW is on, the electric charge moves from the capacitor (capacitive element Ca) of the partial detection area PAA to the capacitor (capacitive element Cb) of the detection signal amplifier 42 of the detection circuit 48. At this time, the non-inverting input (+) of the detection signal amplifier 42 is set to the reference potential (Vref) voltage (for example, 0.75 V). As a result, the output (Vout) of the third switching element TrS is also set to the reference potential (Vref) voltage due to the virtual short-circuit between input ends of the detection signal amplifier 42.

The voltage of the capacitive element Cb is set to a voltage corresponding to the electric charge stored in the capacitor (capacitive element Ca) of the partial detection area PAA at a location where the third switching element TrS is turned on in response to the selection signal ASW(k). After the output (Vout) of the third switching element TrS is set to the reference potential (Vref) voltage due to the virtual short-circuit, the output of the detection signal amplifier 42 reaches a voltage corresponding to the capacitance of the capacitive element Cb, and this output voltage is read by the A/D converter 43. The voltage of the capacitive element Cb is, for example, a voltage between two electrodes provided on a capacitor constituting the capacitive element Cb.

The period t1 is 20 μs, for example. The period t2 is 60 μs, for example. The period t3 is 44.7 μs, for example. The period t4 is 0.98 μs, for example.

As illustrated in FIG. 10, in each of a period t(1) and a period t(2), the detection device 1 executes the processing in the reset period Prst, the exposure periods Pex {(1), . . . , (M)}, and the read period Pdet described above. In the reset period Prst and the read period Pdet, the gate line drive circuit 15 sequentially scans the gate lines from GCL(1) to GCL(M). In the following description, "detection of one frame" denotes the detection in each period t, that is, the detection in which the gate lines from GCL(1) to GCL(M) are scanned in the reset period Prst and the read period Pdet, and the detection signals Vdet are acquired from the signal lines SGL in the respective columns.

The light sources (the first light sources 61 or the second light sources 62) are continuously turned on during the periods t(1) and t(2). The control circuit 122 can control the lighting and the non-lighting of the light sources depending on the detection targets. For example, the control circuit 122 may switch between the lighting and the non-lighting of the first and the second light sources 61 and 62 on a period-by-period basis, or may continuously turn on either of them.

FIGS. 6 to 10 illustrate the example in which the gate line drive circuit 15 individually selects the gate line GCL, but the present disclosure is not limited to this example. The gate line drive circuit 15 may simultaneously select a predetermined number (two or more) of the gate lines GCL, and sequentially supply the gate drive signals Vgcl to the gate lines GCL in units of the predetermined number of the gate lines GCL. The signal line selection circuit 16 may also simultaneously couple a predetermined number (two or more) of the signal lines SGL to one detection circuit 48. Moreover, the gate line drive circuit 15 may scan some of the gate lines GCL while skipping the others.

Figure 11A:
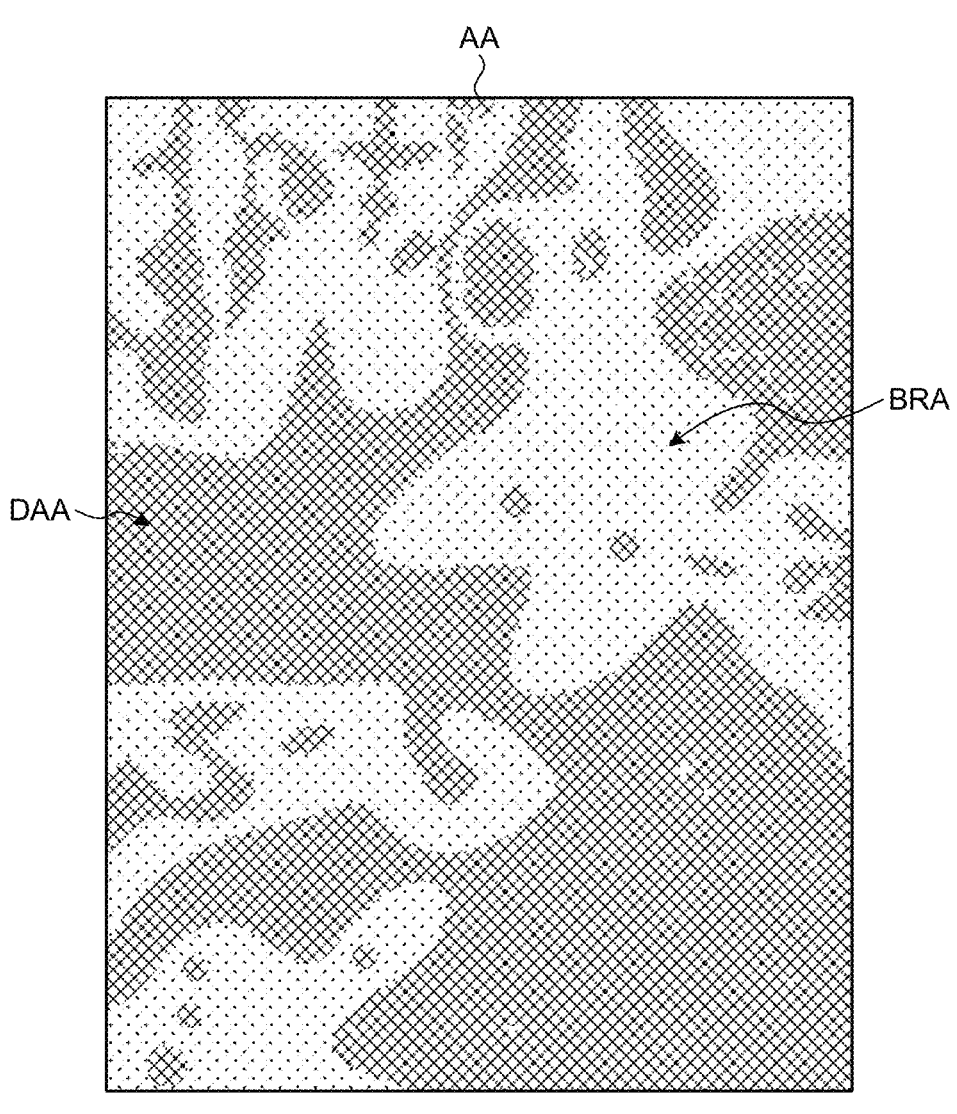
FIG. 11A is an explanatory view of a visualized analog front-end (AFE) signal output level in each of the partial detection areas in a detection area.
Figure 11B:
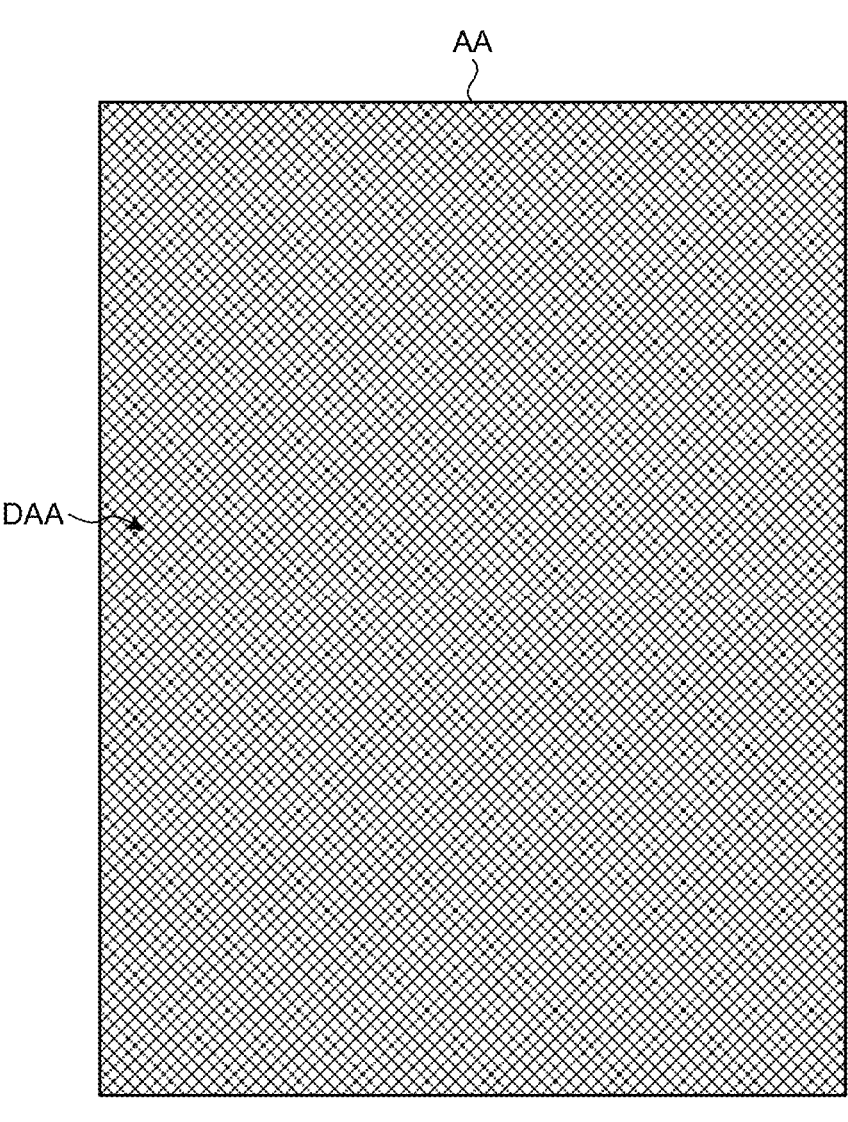
FIG. 11B is another explanatory view of the visualized AFE signal output level in each of the partial detection areas in the detection area.

When variations are generated in the organic semiconductor layer in which the optical sensors PD (organic photodiodes (OPDs)) are formed, the characteristics of the OPDs may vary to cause degradation in detection accuracy. FIGS. 11A and 11B are explanatory views of a visualized analog front-end (AFE) signal output level in each of the partial detection areas in the detection area. FIG. 11A illustrates an example of visualizing an AFE signal output level in the detection area AA when the characteristics of the OPDs vary. FIG. 11B illustrates an example of visualizing an ideal AFE signal output level in the detection area AA when the characteristics of the OPDs vary less. FIGS. 11A and 11B illustrate the examples of visualizing the AFE signal output level when the light sources (for example, the first and the second light sources 61 and 62 of the detection device 1 according to the embodiment) are off, and the OPDs (optical sensors PD) in the partial detection areas PAA in the detection area AA are reverse-biased at 2.0 V.

The generation of the variations in the organic semiconductor layer causes variations in the AFE signal output level in the partial detection areas PAA of the detection area AA, thus generating relatively darker areas and relatively brighter areas as illustrated in FIG. 11A, causing unevenness in the detection area AA. Hereafter, the relatively darker areas are each called "dark area DAA", and the relatively brighter areas are each called "bright area BRA".

Figure 12A:
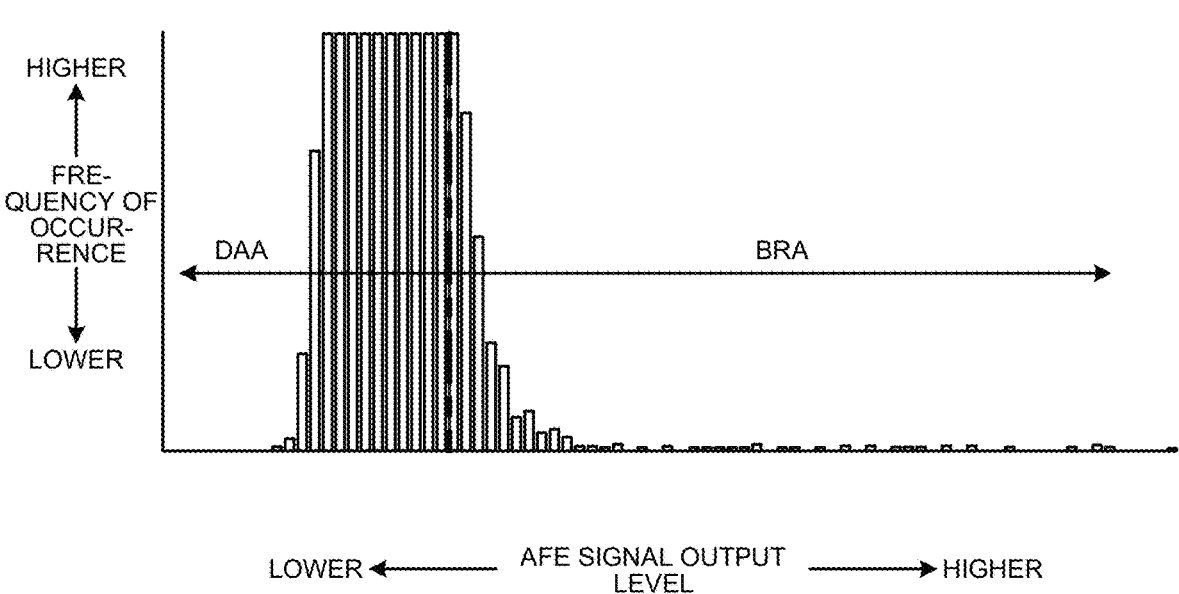
FIG. 12A is a histogram illustrating the AFE signal output level in FIG. 11A.
Figure 12B:
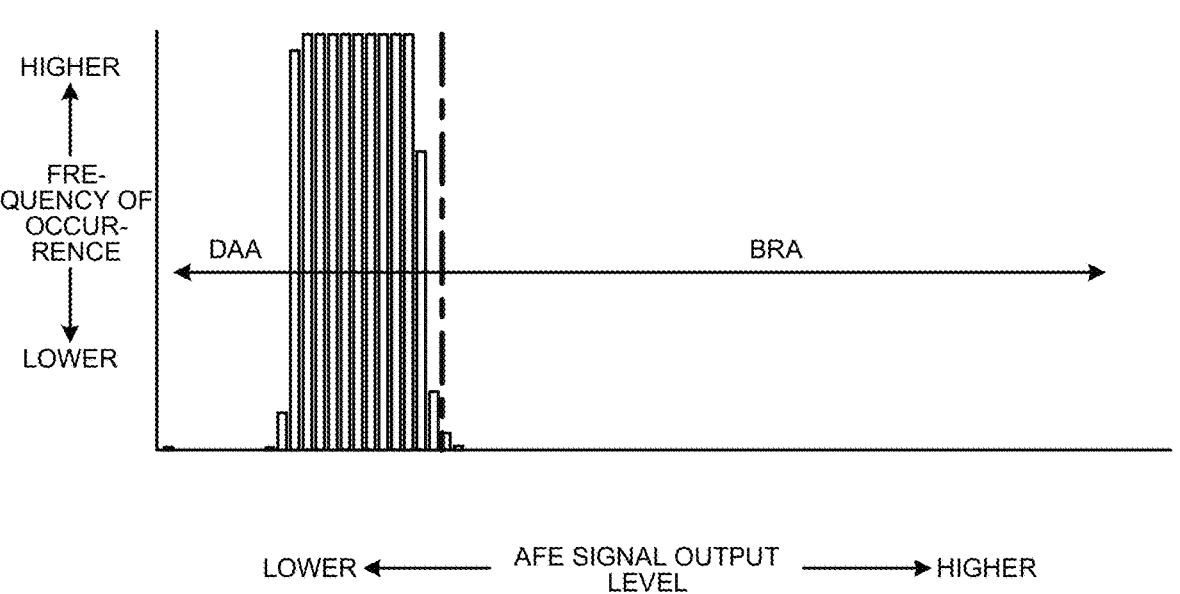
FIG. 12B is a histogram illustrating the AFE signal output level in FIG. 11B.

FIG. 12A is a histogram illustrating the AFE signal output level in FIG. 11A. FIG. 12B is a histogram illustrating the AFE signal output level in FIG. 11B.

As illustrated in FIG. 12A, in FIG. 11A, the variations in the AFE signal output level in the partial detection areas PAA of the detection area AA are larger, and the AFE signal output level extends to a higher output side.

In contrast, when the variations in the AFE signal output level in the partial detection areas PAA of the detection area AA are smaller, the unevenness in the detection area AA is reduced as illustrated in FIG. 11B, and the dark area DAA occupies a main portion of the detection area AA, as illustrated in FIG. 12B.

Figures 13, 14:
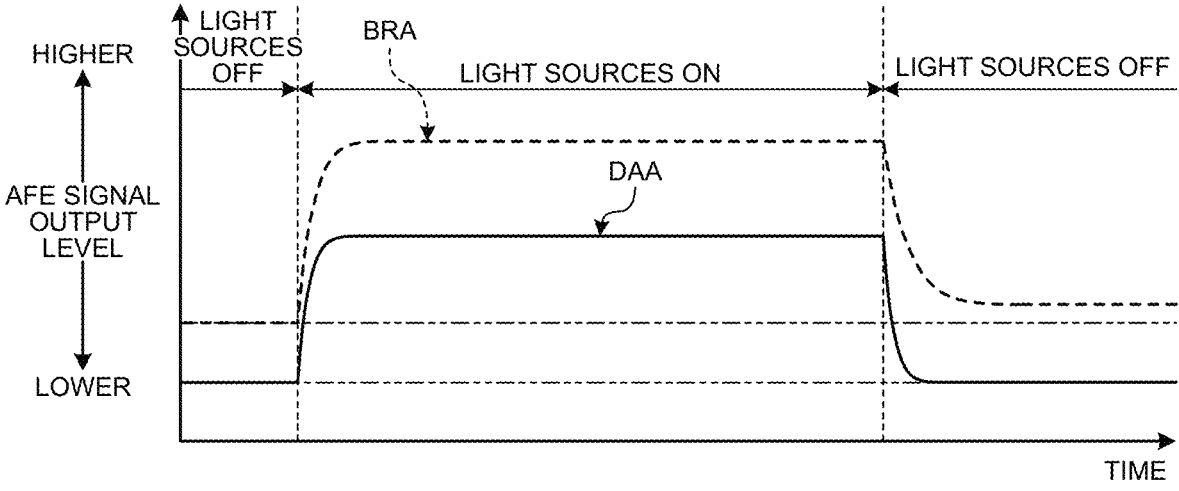
FIG. 13 is a graph illustrating a change in the AFE signal output level when a reverse bias voltage applied to an organic photo diode (OPD) is changed.
FIG. 14 is a graph illustrating a followability of the AFE signal output level when the light sources are turned on and off.

FIG. 13 is a graph illustrating a change in the AFE signal output level when a reverse bias voltage applied to the organic photo diode (OPD) is changed. In FIG. 13, a solid line indicates the change in the AFE signal output level of the partial detection area PAA belonging to the dark area DAA of the detection area AA, and a dashed line indicates the change in the AFE signal output level of the partial detection area PAA belonging to the bright area BRA of the detection area AA.

As illustrated in FIG. 13, in the dark area DAA, the AFE signal output level is almost constant when the reverse bias voltage applied to the OPD is in the range from 0 V to 5 V, while in the bright area BRA, the AFE signal output level changes when the reverse bias voltage applied to the OPD is in the range from 0 V to 5 V. Specifically, in the bright area BRA, the AFE signal output level gradually increases in the process in which the reverse bias voltage applied to the OPD is changed from 0 V to 5 V.

FIG. 14 is a graph illustrating a followability of the AFE signal output level when the light sources are turned on and off. In FIG. 14, a solid line indicates the change in the AFE signal output level of the partial detection area belonging to the dark area DAA of the detection area AA, and a dashed line indicates the change in the AFE signal output level of the partial detection area belonging to the bright area BRA of the detection area AA.

As illustrated in FIG. 14, a turn-on time when the light sources are controlled from off to on and a turn-off time when the light sources are controlled from on to off are longer in the bright area BRA than in the dark area DAA. Specifically, for example, in cases where the pulsation, the pulse waves, and the like are acquired as the information on the living body, the detection accuracy may be significantly degraded if, in particular, the turn-off time increases.

Figure 15:
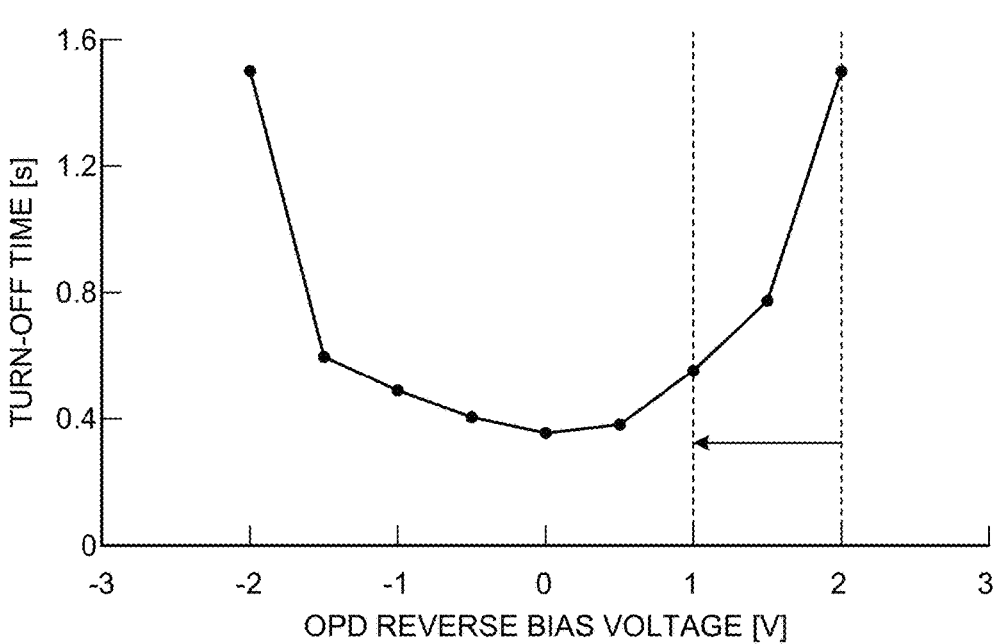
FIG. 15 is a graph illustrating a change in turn-off time when the OPD reverse bias voltage is changed in a bright area.

FIG. 15 is a graph illustrating a change in the turn-off time when the OPD reverse bias voltage is changed in the bright area BRA. The turn-off time, that is, the optical response, when the OPD reverse bias voltage is changed in the bright area BRA changes depending on the OPD reverse bias voltage, as illustrated in FIG. 15. For this reason, the response delay of the optical response can be reduced by changing the OPD reverse bias voltage. In the example illustrated in FIG. 15, the turn-off time is significantly reduced by reducing the OPD reverse bias voltage from 2 V to 1 V. As illustrated in FIG. 13, the AFE signal output level in the bright area BRA is made closer to the AFE signal output level in the dark area DAA by reducing the OPD reverse bias voltage from 2 V to 1 V.

In the present embodiment, the reverse bias voltage applied to the optical sensor PD in the detection period has a different value for each of the partial detection areas PAA, that is, for each of the optical sensors PD. Specifically, the reverse bias voltage (first voltage) applied to the optical sensor PD is set to 2 V in the dark area DAA, and the reverse bias voltage (second voltage) applied to the optical sensor PD is set to 1 V in the bright area BRA. This setting can reduce the variations in the AFE signal output level in the entire detection area AA during the detection period.

The following describes a configuration and an operation to reduce the variations in the AFE signal output level in the entire detection area AA during the detection period.

Figure 16:
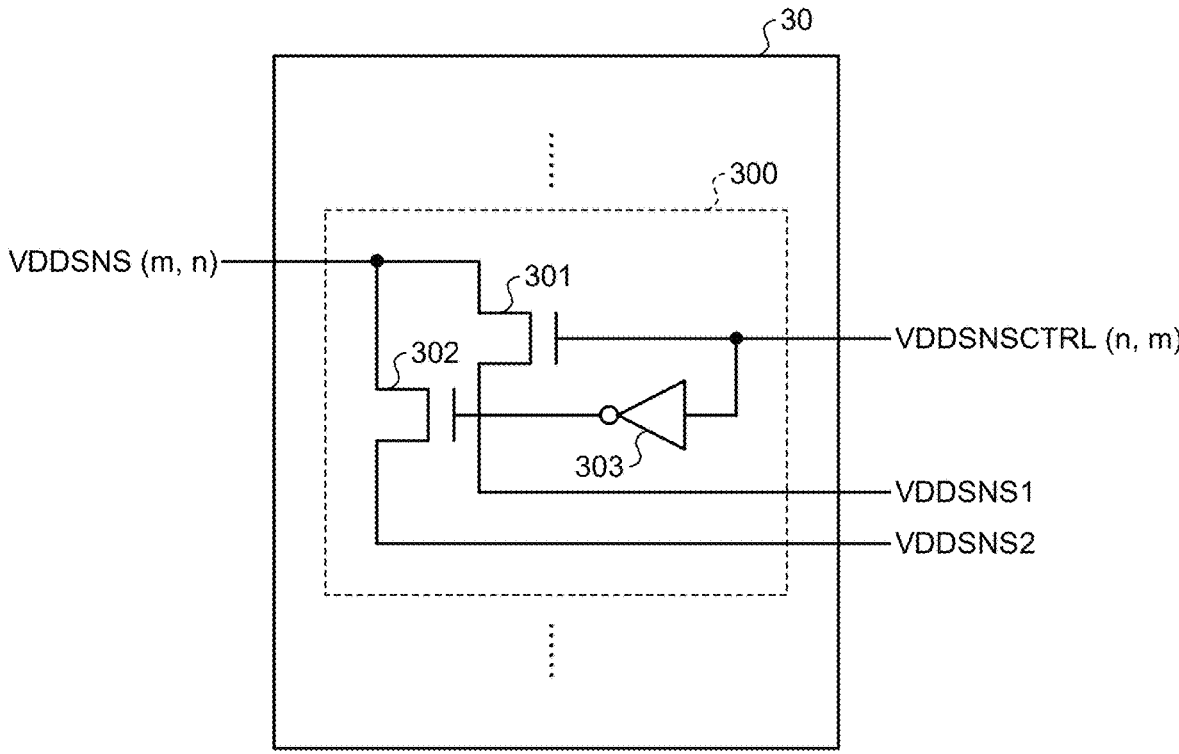
FIG. 16 is a diagram illustrating an exemplary circuit configuration of a sensor power supply circuit.
Figure 17:
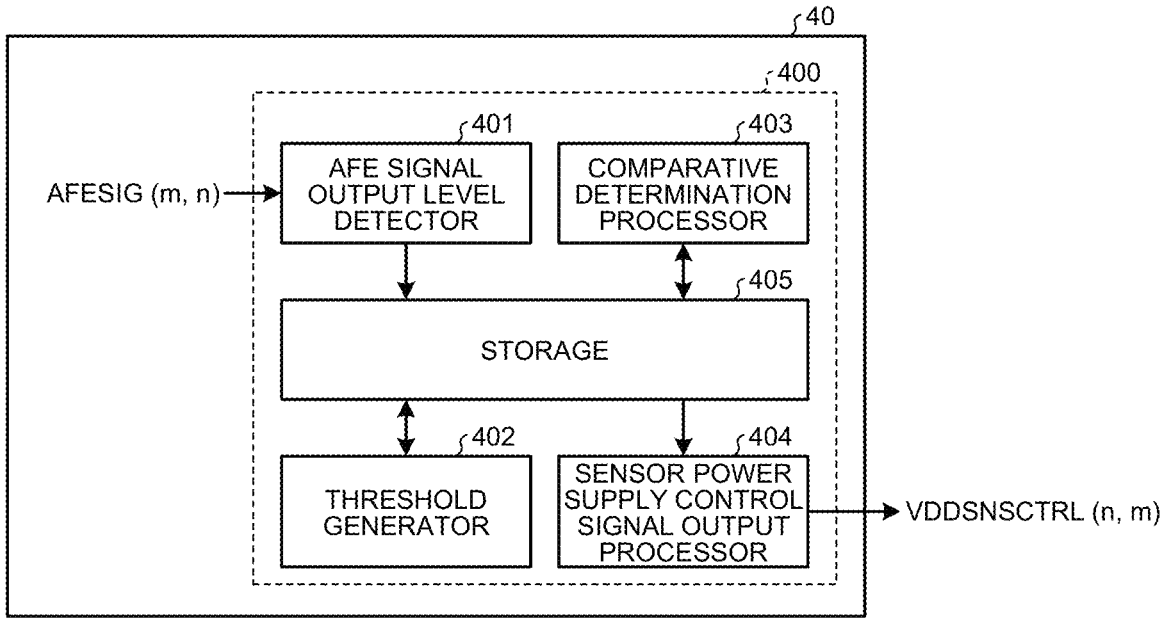
FIG. 17 is a diagram illustrating an exemplary circuit configuration of a sensor power control circuit.

FIG. 16 is a diagram illustrating an exemplary circuit configuration of a sensor power supply circuit. FIG. 17 is a diagram illustrating an exemplary circuit configuration of a sensor power control circuit.

As illustrated in FIG. 16, a sensor power supply circuit 300 is provided, for example, in the sensor power supply potential setting circuit 30. The sensor power supply circuit 300 includes a first switch transistor 301, a second switch transistor 302, and a logic inversion circuit 303.

As illustrated in FIG. 17, a sensor power supply control circuit 400 is provided, for example, in the detector 40. The sensor power supply control circuit 400 includes an AFE signal output level detector (AFE signal output level detection circuit) 401, a threshold generator (threshold generation circuit) 402, a comparative determination processor (comparative determination processing circuit) 403, a sensor power supply control signal output processor (sensor power supply control signal output processing circuit) 404, and a storage (storage circuit) 405.

The functions of the AFE signal output level detector 401, the threshold generator 402, the comparative determination processor 403, and the sensor power supply control signal output processor 404 may be integrated into the signal processor 44, for example. The functions of the storage 405 may be integrated into the storage 46, for example.

The sensor power supply circuit 300 is supplied with first sensor power supply potential VDDSNS1 and the second sensor power supply potential VDDSNS2 from the power supply circuit 123. In the present disclosure, the first sensor power supply potential VDDSNS1 is set to −1.25 V, for example. In the present disclosure, the second sensor power supply potential VDDSNS2 is set to −0.25 V, for example.

The sensor power supply control circuit 400 sets the sensor power supply potentials of the optical sensors PD corresponding to the partial detection areas PAA in a sensor power supply potential setting process to be described later, and outputs sensor power supply potential setting information including a setting value of each of the sensor power supply potentials as the sensor power supply control signal VDDSNSCTRL to the sensor power supply circuit 300.

In the detection process described above, the sensor power supply circuit 300 outputs either the first sensor power supply potential VDDSNS1 or the second sensor power supply potential VDDSNS2 to the optical sensors PD corresponding to the partial detection areas PAA based on the sensor power supply control signal VDDSNSCTRL output from the sensor power supply control circuit 400.

Specifically, when the sensor power supply potential setting value for the optical sensor PD corresponding to the partial detection area PAA is "H", the sensor power supply circuit 300 supplies the first sensor power supply potential VDDSNS1 to the optical sensor PD during the detection period. When the sensor power supply potential setting value for the optical sensor PD corresponding to the partial detection area PAA is "L", the sensor power supply circuit 300 supplies the second sensor power supply potential VDDSNS2 to the optical sensor PD during the detection period. This operation can reduce the variations in the AFE signal output level in the entire detection area AA when the detection process is performed during the detection period.

Figure 18:
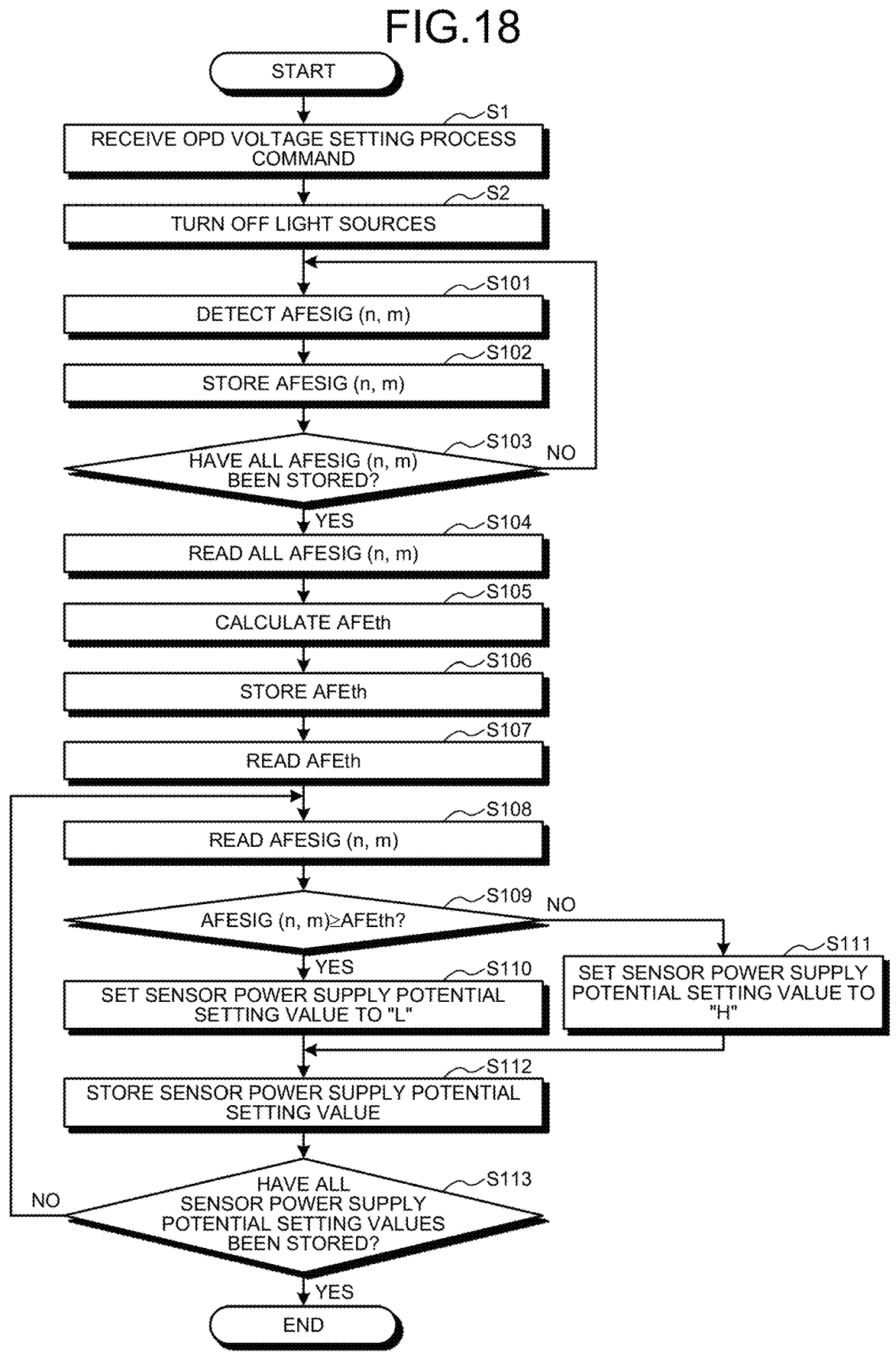
FIG. 18 is a flowchart illustrating an exemplary sensor power supply potential setting process.
Figure 19:
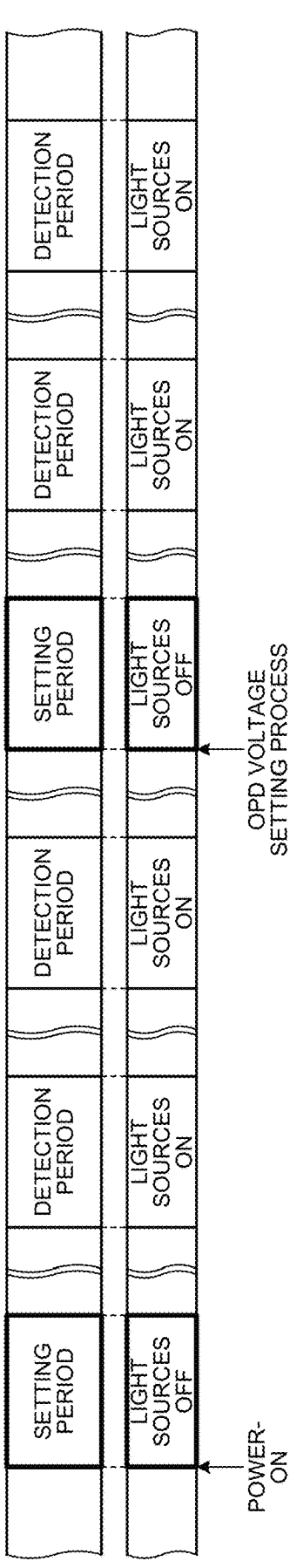
FIG. 19 is a diagram illustrating a relation between a detection period and a setting period.

FIG. 18 is a flowchart illustrating an example of the sensor power supply potential setting process. In the present disclosure, the detection device 1 is provided with a setting period for setting the sensor power supply potential VDDSNS that is different from the detection period described above. The sensor power supply potential setting process illustrated in FIG. 18 is performed during the setting period. FIG. 19 is a diagram illustrating a relation between the detection period and the setting period. As illustrated in FIG. 19, the light sources (first light sources 61 and second light sources 62) are caused to be off during the setting period.

The variations in the AFE signal output level illustrated in FIGS. 11A and 12A are not constant and change over time. Therefore, an aspect is preferable in which the sensor power supply potential setting process illustrated in FIG. 18 is performed (the setting period is provided) based on, for example, an OPD voltage setting process command appropriately received from an external host device, as illustrated in FIG. 19. Another aspect may be such that the sensor power supply potential setting process illustrated in FIG. 18 is performed (the setting period is provided), for example, at the time of power-on of the detection device 1, as illustrated in FIG. 19. In the following description, the aspect will be described in which the sensor power supply potential setting process illustrated in FIG. 18 is performed (the setting period is provided) based on the OPD voltage setting process command output from the control circuit 122.

After the OPD voltage setting process command is output from the external host device (Step S1), the control circuit 122 supplies the control signals to the first and the second light sources 61 and 62 to turn off the first and the second light sources 61 and 62 (Step S2). If the first and the second light sources 61 and 62 are off when the OPD voltage setting process command is output, the processing at Step S2 is skipped.

At this point of time, the sensor power supply control signal output processor 404 of the sensor power supply control circuit 400 sets the setting value of the sensor power supply control signal VDDSNSCTRL for all the optical sensors PD in the detection area AA to "H" so as to set, to the first sensor power supply potential VDDSNS1 (−1.25 V), the sensor power supply potential of all the optical sensors PD corresponding to the partial detection areas PAA of the detection area AA output from the sensor power supply circuit 300. This operation reversely biases all the optical sensors PD corresponding to the partial detection areas PAA of the detection area AA to 2.0 V.

The AFE signal output level detector 401 detects an AFE output signal level AFESIG(n, m) (refer to FIG. 4) output from the detection circuit 48 (Step S101), and sequentially stores the AFE output signal level AFESIG(n, m) in the storage 405 (Step S102).

The AFE signal output level detector 401 determines whether all AFE output signal levels AFESIG(n, m) corresponding to the partial detection areas PAA of the detection area AA have been fully stored (Step S103). If all AFE output signal levels AFESIG(n, m) corresponding to the partial detection areas PAA of the detection area AA have not been fully stored (No at Step S103), the AFE signal output level detector 401 repeats the processing at Steps S101 and S102 until all the AFE output signal levels AFESIG(n, m) corresponding to the partial detection areas PAA of the detection area AA are stored (Yes at Step S103).

FIG. 20 illustrates an example of the AFE output signal level information.

If all the AFE output signal levels AFESIG(n, m) corresponding to the partial detection areas PAA of the detection area AA have been fully stored (Yes at Step S103), the AFE output signal level information illustrated in FIG. 20 is generated. The threshold generator 402 reads the AFE output signal level information stored in the storage 405 (S104) and calculates a threshold AFEth for the AFE output signal level AFESIG(n, m) (Step S105).

Figure 21:
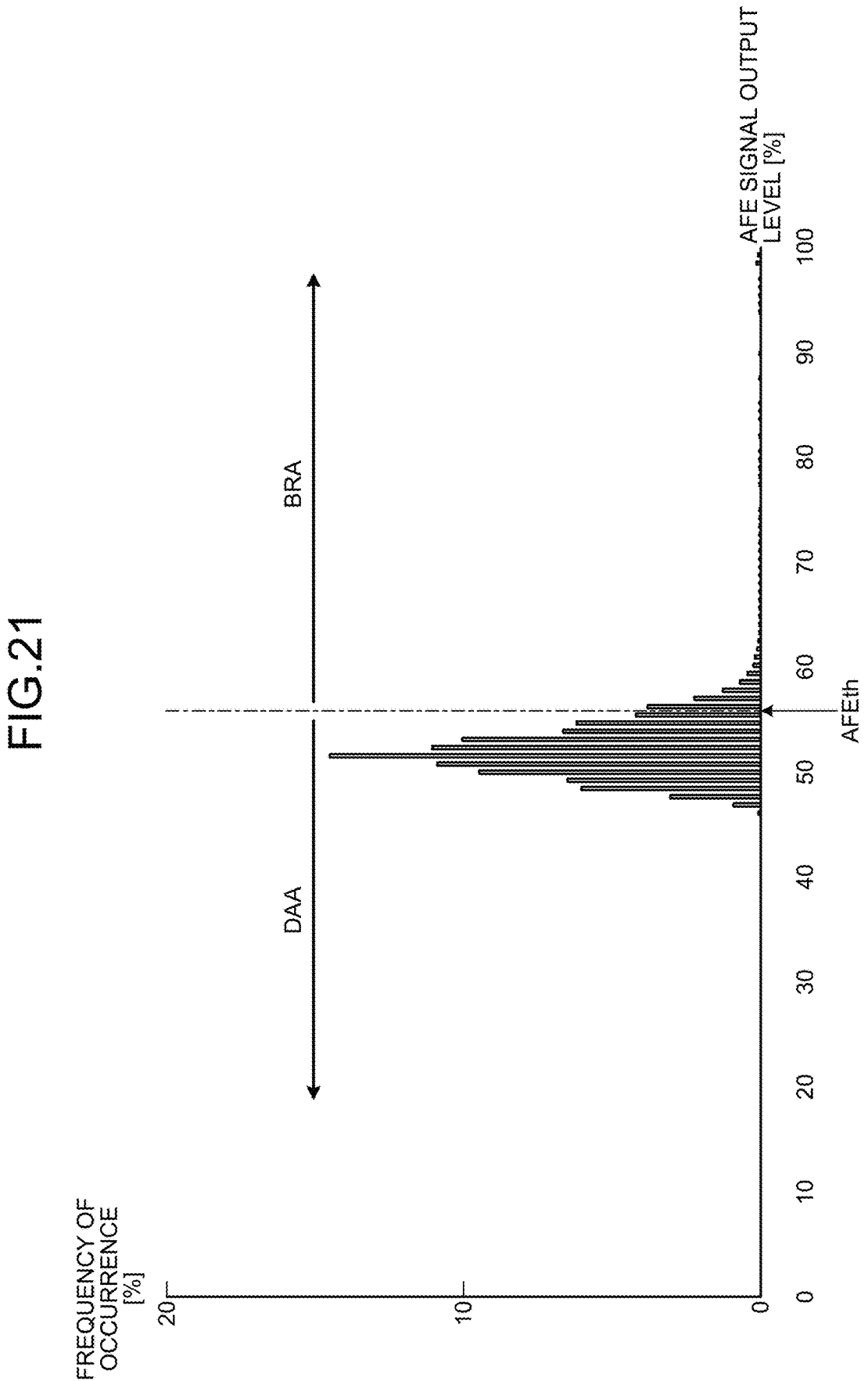
FIG. 21 illustrates an exemplary threshold for the AFE signal output level.

FIG. 21 illustrates an example of the threshold for the AFE signal output level. The threshold generator 402 sets, as the threshold AFEth, for example, the lower limit value among the top 10% of the AFE output signal levels AFESIG (n, m), where 100% is assumed to represent all the optical sensors PD corresponding to the partial detection areas PAA of the detection area AA. That is, the threshold generator 402 sets the threshold AFEth such that the ratio of the first number to the second number is a predetermined value (for example, 1:9), where the first number is the number of the partial detection areas PAA belonging to the bright area BRA where the AFE output signal level AFESIG(n, m) is equal to or higher than the threshold AFEth, and the second number is the number of the partial detection areas PAA belonging to the dark area DAA where the AFE output signal level AFESIG(n, m) is lower than the threshold AFEth. The calculation method or setting method and the setting value of the threshold AFEth in the present disclosure are exemplary and are not limited to those described above.

The threshold generator 402 stores the calculated threshold AFEth in the storage 405 (Step S106).

The comparative determination processor 403 reads the threshold AFEth stored in the storage 405 (Step S107). The comparative determination processor 403 sequentially reads all the AFE output signal levels AFESIG(n, m) corresponding to the partial detection areas PAA of the detection area AA from the AFE output signal level information illustrated in FIG. 20 (Step S108). The comparative determination processor 403 determines whether each of the read AFE output signal levels AFESIG(n, m) is equal to or higher than the threshold AFEth (Step S109).

If the read AFE output signal level AFESIG(n, m) is equal to or higher than the threshold AFEth (Yes at Step S109), the comparative determination processor 403 sets the sensor power supply potential setting value for the optical sensor PD of the partial detection area PAA corresponding to the AFE output signal level AFESIG(n, m) to "L" (Step S110), and stores the sensor power supply potential setting value in the storage 405 (Step S112).

If the read AFE output signal level AFESIG(n, m) is lower than the threshold AFEth (No at Step S109), the comparative determination processor 403 sets the sensor power supply potential setting value for the optical sensor PD of the partial detection area PAA corresponding to the AFE output signal level AFESIG(n, m) to "H" (Step S111), and stores the sensor power supply potential setting value in the storage 405 (Step S112).

The comparative determination processor 403 determines whether the sensor power supply potential setting values of all the optical sensors PD corresponding to the partial detection areas PAA of the detection area AA have been stored (Step S113). If the sensor power supply potential setting values of all the optical sensors PD corresponding to the partial detection areas PAA of the detection area AA have not been stored (No at Step S113), the comparative determination processor 403 repeats the processing from Step S108 to Step S112 until the sensor power supply potential setting values of all the optical sensors PD corresponding to the partial detection areas PAA of the detection area AA are stored (Yes at Step S113).

FIG. 22 illustrates an example of the sensor power supply potential setting information.

When the sensor power supply potential setting values of all the optical sensors PD corresponding to the partial detection areas PAA of the detection area AA have been stored (Yes at Step S113), the sensor power supply potential setting process ends. Thus, the sensor power supply potential setting information illustrated in FIG. 22 is generated.

In the detection process described above, the sensor power supply potential setting information set in the sensor power supply potential setting process illustrated in FIG. 18 is output as the sensor power supply control signal VDDSNSCTRL to the sensor power supply circuit 300. Thereby, when the sensor power supply potential setting value for the optical sensor PD corresponding to the partial detection area PAA is "H", the sensor power supply circuit 300 supplies the first sensor power supply potential VDDSNS1 to the optical sensor PD. As a result, the optical sensor PD included in the dark area DAA is reverse-biased at 2.0 V.

When the sensor power supply potential setting value for the optical sensor PD corresponding to the partial detection area PAA is "L", the sensor power supply circuit 300 supplies the second sensor power supply potential VDDSNS2 to the optical sensor PD. As a result, the optical sensor PD included in the bright area BRA is reverse-biased at 1.0 V.

Thus, in the detection device 1 according to the embodiment, in the detection process, the optical sensor PD included in the dark area DAA is reverse-biased at 2.0 V, and the optical sensor PD included in the bright area BRA is reverse-biased at 1.0 V. As a result, the variations in the AFE signal output level in the detection area AA during the detection process can be reduced, and thus can improve the detection accuracy and the imaging characteristics of the detection device 1.

In the embodiment described above, the example has been described in which the sensor power supply circuit 300 is provided in the sensor power supply potential setting circuit 30, but, in an aspect, the sensor power supply circuit 300 may be provided, for example, for each of the partial detection areas PAA. In this case, the aspect only needs to be such that the sensor power supply potential setting circuit 30 can output the sensor power supply potential setting value to each of the sensor power supply circuits 300 corresponding to the partial detection areas PAA based on the sensor power supply control signal VDDSNSCTRL, and the power supply circuit 123 supplies the first sensor power supply potential VDDSNS1 and the second sensor power supply potential VDDSNS2 to each of the partial detection areas PAA. In an aspect, the sensor power supply potential setting circuit 30 may include a storage that stores therein the sensor power supply potential setting value corresponding to each of the partial detection areas PAA based on the sensor power supply control signal VDDSNSCTRL. In this manner, the process can be simplified without the need for outputting the sensor power supply control signal VDDSNSCTRL each time the detection process is performed.

In the embodiment described above, the example has been described in which the sensor power supply control circuit 400 is provided in the detector 40, but, in an aspect, the sensor power supply control circuit 400 may be provided, for example, in the detection controller 11. In this case, the aspect only needs to be such that the AFE output signal level AFESIG(n, m) is output from the detection circuit 48 of the detector 40 to the detection controller 11. In an aspect, the sensor power supply control circuit 400 may be independent of the detector 40 and the detection controller 11.

In the embodiment described above, the example has been described in which the sensor power supply circuit 300 is provided in the sensor power supply potential setting circuit 30, but, in an aspect, the sensor power supply circuit 300 may be provided for each area including the partial detection areas PAA arranged along the first direction Dx, or for each area including the partial detection areas PAA arranged along the second direction Dy. Alternatively, the sensor power supply circuit 300 may be provided for each predetermined area in which more than one of the partial detection areas PAA are arranged in the first direction Dx and the second direction Dy. In this case, if the number of the partial detection areas PAA in the predetermined area in which the value of AFESIG is equal to or higher than the threshold AFEth is equal to or larger than a predetermined number, the sensor power supply potential setting value for the optical sensors PD of the partial detection areas PAA in the predetermined area may be set to "L". If the number of the partial detection areas PAA in which the value of AFESIG is equal to or higher than the threshold AFEth is smaller than the predetermined number, the sensor power supply potential setting value for the optical sensors PD of the partial detection areas PAA in the predetermined area may be set to "H".

Furthermore, in an aspect, for example, the sensor power supply potential setting value may be directly output from the sensor power supply control circuit 400 to each of the sensor power supply circuits 300 provided for the respective partial detection areas PAA.

The components in the embodiment described above can be combined with one another as appropriate. Other operational advantages accruing from the aspects described in the embodiment herein that are obvious from the description herein or that are appropriately conceivable by those skilled in the art will naturally be understood as accruing from the present disclosure.

What is claimed is:

1. A detection device comprising:
a plurality of photodiodes configured to detect information on an object to be detected in a detection area during a predetermined detection period;
a power supply control circuit configured to individually control a reverse bias voltage applied to each of the photodiodes; and
a plurality of power supply circuits configured to supply, to each of the photodiodes, a first potential at which the reverse bias voltage is set to a first voltage or a second potential at which the reverse bias voltage is set to a second voltage lower than the first voltage, based on a control signal from the power supply control circuit,
wherein the photodiodes are respectively provided for a plurality of partial detection areas of the detection area, and
wherein the power supply control circuit is configured to:
detect an output level of a signal output from each of the partial detection areas when the first potential is supplied to the photodiodes during a setting period different from the detection period, and
control the power supply circuits so as to supply the second potential to the photodiode of the partial detection area in which the output level of the signal is equal to or higher than a predetermined threshold during the detection period.

2. The detection device according to claim 1,
wherein the power supply control circuit is configured to set the threshold such that a ratio between the number of the partial detection areas in which the output level of the signal is equal to or higher than the threshold and the number of the partial detection areas in which the output level of the signal is lower than the threshold is a predetermined value.

3. The detection device according to claim 1,
wherein the second voltage is substantially half the first voltage.

4. The detection device according to claim 1,
wherein the setting period is provided at a time of power-on.

5. The detection device according to claim 1,
wherein the setting period is provided based on a voltage setting process command from outside.

* * * * *